US008466489B2

(12) United States Patent
Salcedo et al.

(10) Patent No.: US 8,466,489 B2
(45) Date of Patent: Jun. 18, 2013

(54) APPARATUS AND METHOD FOR TRANSIENT ELECTRICAL OVERSTRESS PROTECTION

(75) Inventors: Javier A. Salcedo, North Billerica, MA (US); Karl Sweetland, Tyngsborough, MA (US)

(73) Assignee: Analog Devices, Inc., Norwood, MA (US)

( * ) Notice: Subject to any disclaimer, the term of this patent is extended or adjusted under 35 U.S.C. 154(b) by 197 days.

(21) Appl. No.: 13/021,636

(22) Filed: Feb. 4, 2011

(65) Prior Publication Data

US 2012/0199874 A1    Aug. 9, 2012

(51) Int. Cl.
*H01L 29/747* (2006.01)
*H01L 21/332* (2006.01)

(52) U.S. Cl.
USPC ...................................................... 257/120

(58) Field of Classification Search
USPC .................. 257/120, 127, E27.052, 135–136,
257/242, 163–166, 197, 205, 273, 351, 361,
257/378, 423, 427, 474, 477, 517, 526, 539,
257/544, 565–593, 928, E51.004, E31.069,
257/E27.017, E27.019–E27.023,
E27.037–E27.043, E27.053–E27.058,
E27.074–E27.078, E27.106, E27.149,
E29.03–E29.035, E29.114, E29.124,
E29.027–E29.028, E29.066–E29.067,
E29.194–E29.202; 438/170, 189, 202, 309–378
See application file for complete search history.

(56) References Cited

U.S. PATENT DOCUMENTS

| | | | |
|---|---|---|---|
| 3,436,667 A | 4/1969 | Leonard | |
| 4,633,283 A | 12/1986 | Avery | |
| 5,276,582 A | 1/1994 | Merrill et al. | |

(Continued)

FOREIGN PATENT DOCUMENTS

| | | |
|---|---|---|
| DE | 10 2007 040 875 A1 | 3/2009 |
| EP | 0 168 678 A2 | 1/1986 |
| EP | 1 703 560 A2 | 9/2006 |

OTHER PUBLICATIONS

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

(Continued)

*Primary Examiner* — Dao H Nguyen
*Assistant Examiner* — Tram H Nguyen
(74) *Attorney, Agent, or Firm* — Knobbe Martens Olson & Bear LLP

(57) ABSTRACT

An apparatus and method for high voltage transient electrical overstress protection are disclosed. In one embodiment, the apparatus includes an internal circuit electrically connected between a first node and a second node; and a protection circuit electrically connected between the first node and the second node. The protection circuit is configured to protect the internal circuit from transient electrical overstress events while maintaining a relatively high holding voltage upon activation. The holes—or electrons—enhanced conduction protection circuit includes a bi-directional bipolar device having an emitter/collector, a base, and a collector/emitter; a first bipolar transistor having an emitter electrically coupled to the first node, a base electrically coupled to the emitter/collector of the bipolar device, and a collector electrically coupled to the base of the bipolar transistor; and a second bipolar transistor having an emitter electrically coupled to the second node, a base electrically coupled to the collector/emitter of the bipolar device, and a collector electrically coupled to the base of the bipolar transistor.

32 Claims, 28 Drawing Sheets

U.S. PATENT DOCUMENTS

| | | | |
|---|---|---|---|
| 5,341,005 A | 8/1994 | Canclini |
| 5,343,053 A | 8/1994 | Avery |
| 5,652,689 A | 7/1997 | Yuan |
| 5,663,860 A | 9/1997 | Swonger |
| 5,742,084 A | 4/1998 | Yu |
| 5,781,389 A | 7/1998 | Fukuzako et al. |
| 5,889,644 A | 3/1999 | Schoenfeld et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,404,261 B1 | 6/2002 | Grover et al. |
| 6,512,662 B1 | 1/2003 | Wang |
| 6,590,273 B2 | 7/2003 | Okawa et al. |
| 6,667,870 B1 | 12/2003 | Segervall |
| 6,704,180 B2 | 3/2004 | Tyler et al. |
| 6,724,603 B2 | 4/2004 | Miller et al. |
| 6,768,616 B2 | 7/2004 | Mergens et al. |
| 6,960,792 B1 | 11/2005 | Nguyen |
| 7,034,363 B2 | 4/2006 | Chen |
| 7,038,280 B2 | 5/2006 | Righter |
| 7,071,528 B2 | 7/2006 | Ker et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,601,991 B2 | 10/2009 | Salcedo et al. |
| 7,714,357 B2 | 5/2010 | Hayashi et al. |
| 7,834,378 B2 | 11/2010 | Ryu et al. |
| 7,969,006 B2 | 6/2011 | Lin et al. |
| 8,044,457 B2 | 10/2011 | Salcedo et al. |
| 8,222,698 B2 | 7/2012 | Salcedo et al. |
| 2001/0040254 A1 | 11/2001 | Takiguchi |
| 2002/0021538 A1 | 2/2002 | Chen et al. |
| 2002/0122280 A1 | 9/2002 | Ker et al. |
| 2002/0187601 A1 | 12/2002 | Lee et al. |
| 2003/0076636 A1 | 4/2003 | Ker et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1 | 2/2009 | Tseng et al. |
| 2009/0230426 A1 | 9/2009 | Carpenter et al. |
| 2009/0309128 A1 | 12/2009 | Salcedo et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1* | 7/2011 | Gendron et al. ............... 361/56 |
| 2011/0284922 A1 | 11/2011 | Salcedo et al. |
| 2011/0303947 A1* | 12/2011 | Salcedo et al. ............. 257/173 |
| 2011/0304944 A1 | 12/2011 | Salcedo et al. |
| 2012/0007207 A1 | 1/2012 | Salcedo |
| 2012/0008242 A1* | 1/2012 | Salcedo ......................... 361/56 |
| 2012/0205714 A1 | 8/2012 | Salcedo et al. |
| 2012/0293904 A1 | 11/2012 | Salcedo et al. |

OTHER PUBLICATIONS

Salcedo et al., Electrostatic Discharge Protection Framework for Mixed-Signal High Voltage CMOS Applications, IEEE Xplore, downloaded Feb. 23, 2010 at 12:53 EST.

Anderson et al., *ESD Protection under Wire Bonding Pads*, EOS/ESD Symposium 99-88, pp. 2A.4.1-2A.4.7 (1999).

* cited by examiner

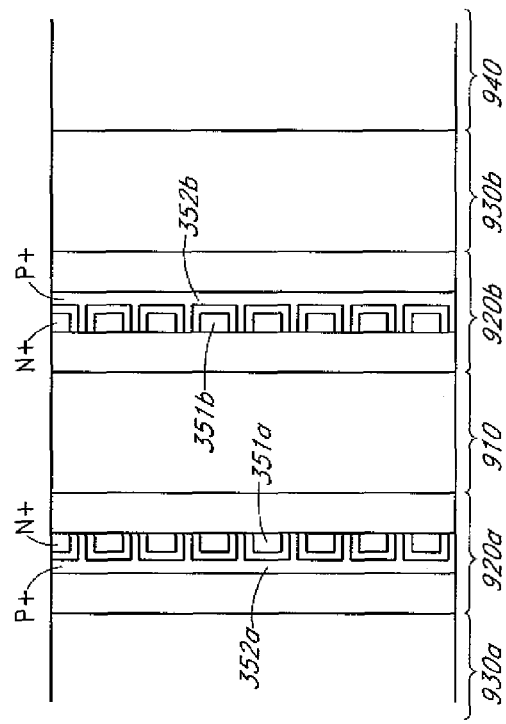
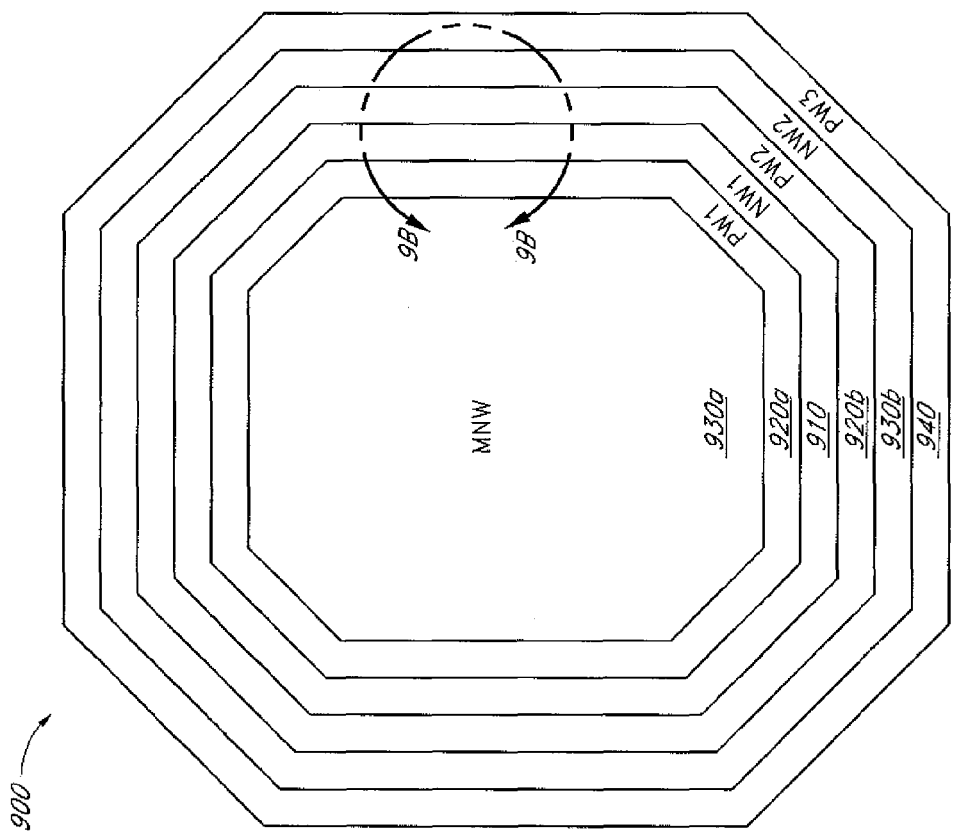

APPARATUS AND METHOD FOR TRANSIENT ELECTRICAL OVERSTRESS PROTECTION

BACKGROUND

1. Field

Embodiments of the invention relate to electronic systems, and more particularly, to protection circuits for integrated electronic systems.

2. Description of the Related Technology

Certain electronic systems can be exposed to a transient electrical event, or an electrical signal of a relatively short duration having rapidly changing voltage and high power. Transient electrical events can include, for example, electrical overstress/electro static discharge (EOS/ESD) events arising from the abrupt release of charge from an object or person to an electronic system. Transient electrical events can also include, for example, voltage spikes resulting from delivering a varying current to an inductive load, signals received by way of electromagnetic inductive coupling, or transient electrical events arising from starting a motor, such as a load dump transient electrical event resulting from starting an automotive engine.

Transient electrical events can destroy an integrated circuit (IC) inside an electronic system due to overvoltage or undervoltage conditions and high levels of power dissipation over relatively small areas of the IC. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path) if the input/output is not able to keep a high holding voltage upon activation of protection components, thereby disrupting the functioning of the IC and potentially causing permanent damage to the IC from self-heating in the latch-up current path. Thus, there is a need to provide an IC with robust protection from a variety of transient electrical stress conditions and extreme false conditions events at different stages of manufacturing and during circuit operation.

SUMMARY

In one embodiment, an apparatus comprises an internal circuit electrically connected between a first node and a second node; and a protection circuit electrically connected between the first node and the second node. The protection circuit is configured to protect the internal circuit from transient electrical events. The protection circuit comprises: a bi-directional bipolar device having an emitter/collector, a base, and a collector/emitter; a first bipolar transistor having an emitter electrically coupled to the first node, a base electrically coupled to the emitter/collector of the bipolar device, and a collector electrically coupled to the base of the bipolar device; and a second bipolar transistor having an emitter electrically coupled to the second node, a base electrically coupled to the collector/emitter of the bipolar device, and a collector electrically coupled to the base of the bipolar device.

In another embodiment, an apparatus for providing protection from transient electrical events is provided. The apparatus comprises a protection device which includes: a substrate; a central well disposed in the substrate, wherein the central well has a doping of a first type; and a first well disposed in the substrate adjacent to the central well, wherein the first well has a doping of a second type opposite to the first type. The apparatus also includes a second well disposed in the substrate adjacent to the central well and opposite side of the central well from the first well, wherein the second well has a doping of the second type; and a first active region and a second active region disposed in the first well. The second active region has a portion farther from the central well than at least a portion of the first active region. The first active region has a doping of the first type, and the second active region has a doping of the second type. The apparatus also includes a third active region and a fourth active region disposed in the second well, the fourth active region having a portion farther from the central well than at least a portion of the third active region, the third active region having a doping of the first type, the fourth active region having a doping of the second type. The central well, the first well, and the second well are configured to operate as a bi-directional bipolar device having an emitter/collector, a base, and a collector/emitter. The first active region, the second active region, the first well, and the central well are configured to operate as a first bipolar transistor having an emitter, a base, and a collector. The third active region, the fourth active region, the second well, and the central well are configured to operate as a second bipolar transistor having an emitter, a base, and a collector.

In yet another embodiment, a method for providing protection from transient electrical events is provided. The method comprises: providing a substrate; forming a central well in the substrate, wherein the central well has a doping of a first type; forming a first well in the substrate adjacent to the central well, wherein the first well has a second polarity type opposite to the first type; and forming a second well in the substrate adjacent to the central well and opposite side of the central well from the first well, wherein the second well has a doping of the second type. The method also includes: forming a first active region and a second active region in the first well, the second active region having a portion farther from the central well than at least a portion of the first active region, the first active region having a doping of the first type, the second active region having a doping of the second type; and forming a third active region and a fourth active region in the second well, the fourth active region having a portion farther from the central well than at least a portion of the third active region, the third active region having a doping of the first type, the fourth active region having a doping of the second type. The central well, the first well, and the second well are configured to operate as a bi-directional bipolar device having an emitter/collector, a base, and a collector/emitter. The first active region, the second active region, the first well, and the central well are configured to operate as a first bipolar transistor having an emitter, a base, and a collector. The third active region, the fourth active region, the second well, and the central well are configured to operate as a second bipolar transistor having an emitter, a base, and a collector.

BRIEF DESCRIPTION OF THE DRAWINGS

FIG. 9A is a schematic top plan view of an IC protection device having an octagonal shape according to yet another embodiment.

FIG. 9B is an enlarged partial top plan view of the device of FIG. 9A.

DETAILED DESCRIPTION OF EMBODIMENTS

Figure 1A:
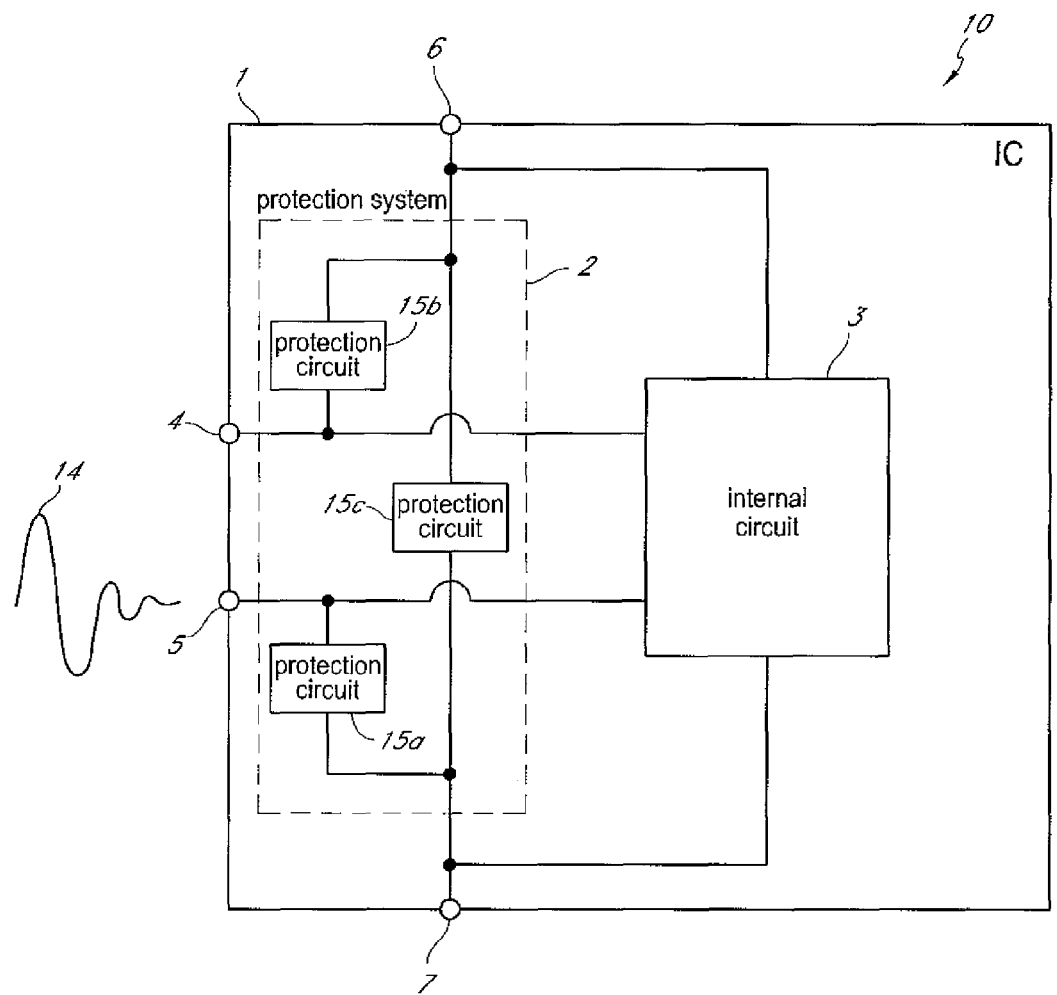
FIG. 1A is a schematic block diagram of one example of an electronic system including an integrated circuit (IC) and a protection system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Certain electronic systems are configured to protect circuits or components therein from transient electrical events. Furthermore, to help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical events as discussed above, including ESD events.

Electronic circuit reliability is enhanced by providing protection circuits to the pads of an IC. Such a protection circuit can also be generally referred to as an "IC protection circuit" or "pad protection circuit" in this document. The protection circuits can maintain the voltage level at the pad within a predefined safe range, and can transition from a high-impedance state to a low-impedance state when the voltage of the transient electrical event reaches a trigger voltage. Thereafter, the protection circuit can shunt at least a portion of the current associated with the transient electrical event before the voltage of a transient electrical event reaches a positive or negative failure voltage that can cause damage to the IC. As will be described in detail later with reference to FIG. 1B, after activation, the protection circuit can remain in the low-impedance state as long as the transient electrical event voltage level is above a positive holding voltage and below a negative holding voltage.

An integrated circuit (IC) can include one or more pads exposed to an operational voltage that can range between a negative voltage and a positive voltage. In certain applications, it is desirable to have a single ESD protection device that can protect an internal circuit from both negative and positive transient signals. Using a single protection circuit to provide protection against both positive and negative transient electrical events can permit a reduction in layout area relative to a design that uses separate structures for protection against positive and negative transient electrical events. In addition, there is a need for an ESD protection device that can be fine tuned for different current and voltage (I-V) characteristics against positive and negative ESD events with fast operational performance and low static power dissipation.

Overview of Electronic Systems with ESD Protection

FIG. 1A is a schematic block diagram of an electronic system 10, which can include one or more protection circuits according to some embodiments. The illustrated electronic system 10 includes an integrated circuit (IC) 1 that includes a protection system 2, an internal circuit 3, and pins or pads 4-7. The internal circuit 3 can be electrically connected to one or more of the pads 4-7. Each of the pads 4-7 can be, for example, one of power pads, ground pads, input pads, output pads, or bidirectional pads.

The IC 1 can be exposed to transient electrical events, such as ESD events, which can cause IC damage and induce latch-up. For example, the pad 5 can receive a transient electrical event 14, which can travel along electrical connections of the IC 1 and reach the internal circuit 3. The transient electrical event 14 can produce overvoltage or undervoltage conditions and can dissipate high levels of power, which can disrupt the functioning of the internal circuit 3 and potentially cause permanent damage. As used herein, an "undervoltage condition" is a negative magnitude overvoltage condition.

In some embodiments, a protection system 2 can be provided to ensure reliability of the IC 1 by maintaining the voltage level at the pads of the IC 1 within a particular range of voltage, which can vary from pad to pad. The protection system 2 can include one or more protection circuits, such as the protection circuits 15a-15c. The protection circuits 15a-15c can be configured to divert a current associated with a transient electrical event received on a pad of the IC to other nodes or pads of the IC, thereby providing transient electrical event protection, as will be described in further detail below.

Protection circuits can be placed, for example, between a power pad and an input pad, between a power pad and an output pad, between a power pad and a bidirectional pad, between a ground pad and an input pad, between a ground pad and an output pad, between a ground pad and a bidirectional pad, and/or between a power pad and a ground pad. When no transient electrical event is present, the protection circuit can remain in a high-impedance/low-leakage state, thereby reducing static power dissipation resulting from leakage current.

The protection system 2 can be integrated on-chip with the IC 1. However, in other embodiments, the protection system 2 can be arranged in a separate IC. For example, the protection system 2 can be included in a separately packaged IC, or it can be encapsulated in a common package with the IC 1. In such embodiments, one or more protection circuits can be placed in a stand-alone IC, in a common package for system-on-a-package applications, or integrated with an IC in a common semiconductor substrate for system-on-a-chip applications.

The IC 1 can be used in, for example, transmission line systems, industrial control, power management systems, microelectromechanical system (MEMS) sensors, transducers, automotive local interconnect network (LIN) and controller interface network (CAN) interface systems, or a variety of other systems. The IC 1 can be utilized in electronic systems in which the pins of the IC are exposed to user contact through a low-impedance connection.

Figure 1B:
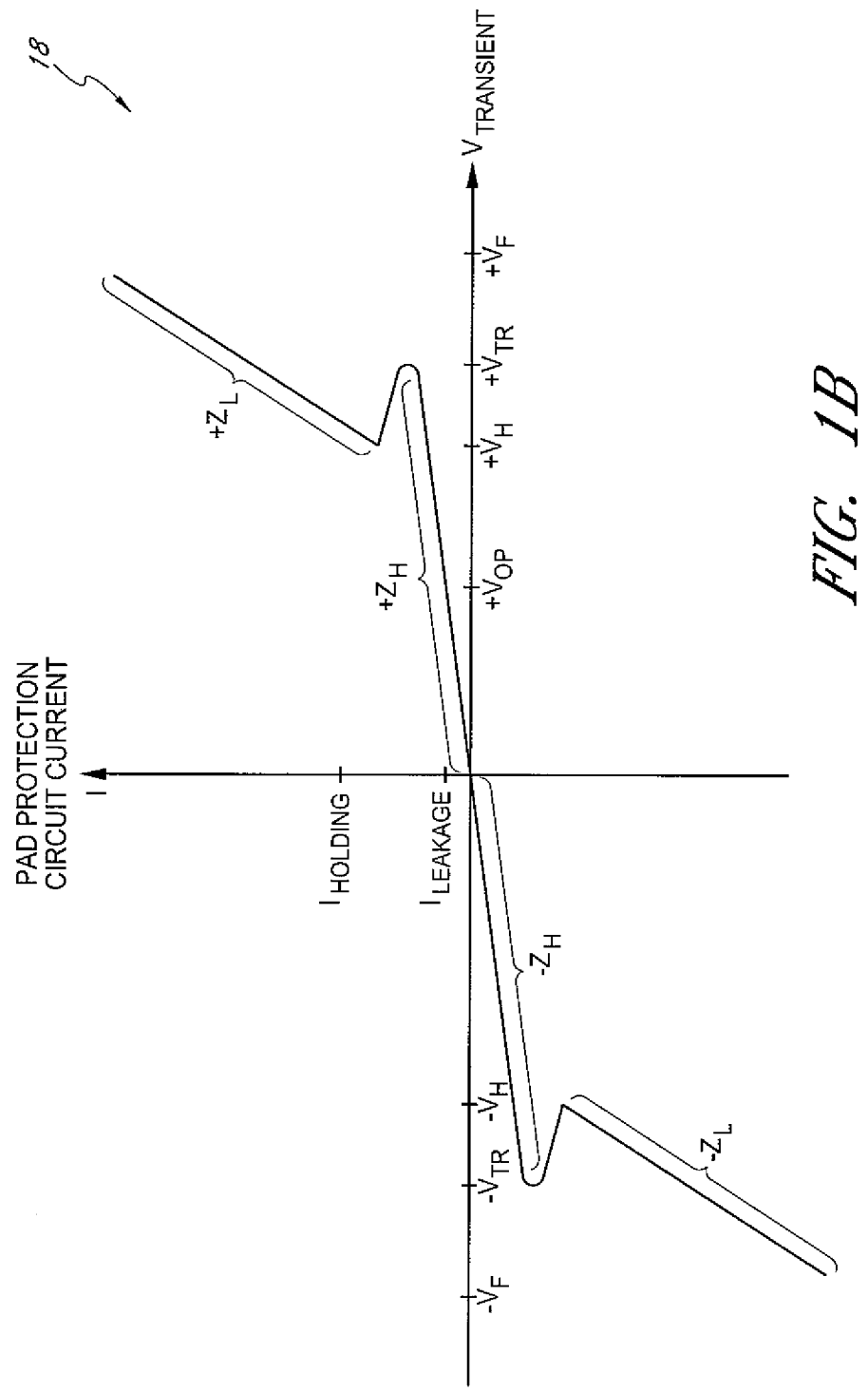
FIG. 1B is a graph showing a relationship between current and voltage of a bi-directional IC protection device according to one embodiment.

FIG. 1B is a graph 18 of one example of current versus transient electrical event voltage of a bi-directional protection circuit. As described above, a protection circuit can be configured to maintain the voltage level at a pad within a pre-defined safe range. Thus, the protection circuit can shunt a large portion of the current associated with the transient signal event before the voltage of the transient signal $V_{TRANSIENT}$ reaches either a positive failure voltage $+V_{FAILURE}$ or a negative failure voltage $-V$ FAILURE that would otherwise cause damage to the IC 1. Additionally, the protection circuit can conduct a relatively low amount of current at the normal operating voltage $V_{OP}$, thereby reducing or minimizing static power dissipation resulting from the leakage current $I_{LEAKAGE}$, which enhances the energy efficiency of the IC.

Furthermore, as shown in the graph 18, the protection circuit can transition from a high-impedance state $+Z_H$ to a low-impedance state $+Z_L$ when the voltage of the transient signal $V_{TRANSIENT}$ reaches a positive trigger voltage $+V_{TR}$. Thereafter, the pad circuit can shunt a large amount of current over a wide range of transient electrical event voltage levels. The pad circuit can remain in the low-impedance state $+Z_L$ as long as the transient signal voltage level is above a positive holding voltage $+V_H$. By configuring the protection circuit to have both a trigger voltage $+V_{TRR}$ and a holding voltage $+V_H$, the protection circuit can have improved performance while having enhanced stability against unintended activation. In certain embodiments, it can be specified for the holding voltage $V_H$ to be above the operating voltage $V_O$ and to have a "Z"-type current versus voltage characteristic response so that the pad circuit does not remain in the low-impedance state $+Z_L$ after passage of the transient signal event and a relatively quick return to normal operating voltage levels.

In the illustrated embodiment, the protection circuit can also shunt a large amount of current for transient signal events having a negative voltage, so that the protection circuit can provide transient electrical event protection against both negative and positive transient signals. The protection circuit can transition from a high-impedance state $-Z_H$ to a low-impedance state $-Z_L$ when the voltage of the transient signal $V_{TRANSIENT}$ reaches a negative trigger voltage $-V_{TR}$, thereby shunting a large negative amount of current. The pad circuit can remain in the low-impedance state $-Z_L$ as long as the transient signal voltage level is below a negative holding voltage $-V_H$.

In FIG. 1B, voltage is expressed along a horizontal axis, and current is expressed along a vertical axis. In the illustrated embodiment, the protection circuit has I-V characteristics that are symmetrical. In other embodiments, the protection circuit can have asymmetrical I-V characteristics. For example, the protection circuit can have different trigger voltages, holding voltages, and/or failure voltages with different I-V curves in the positive and negative regions of the graph.

Bi-Directional Protection Devices

Figure 2:
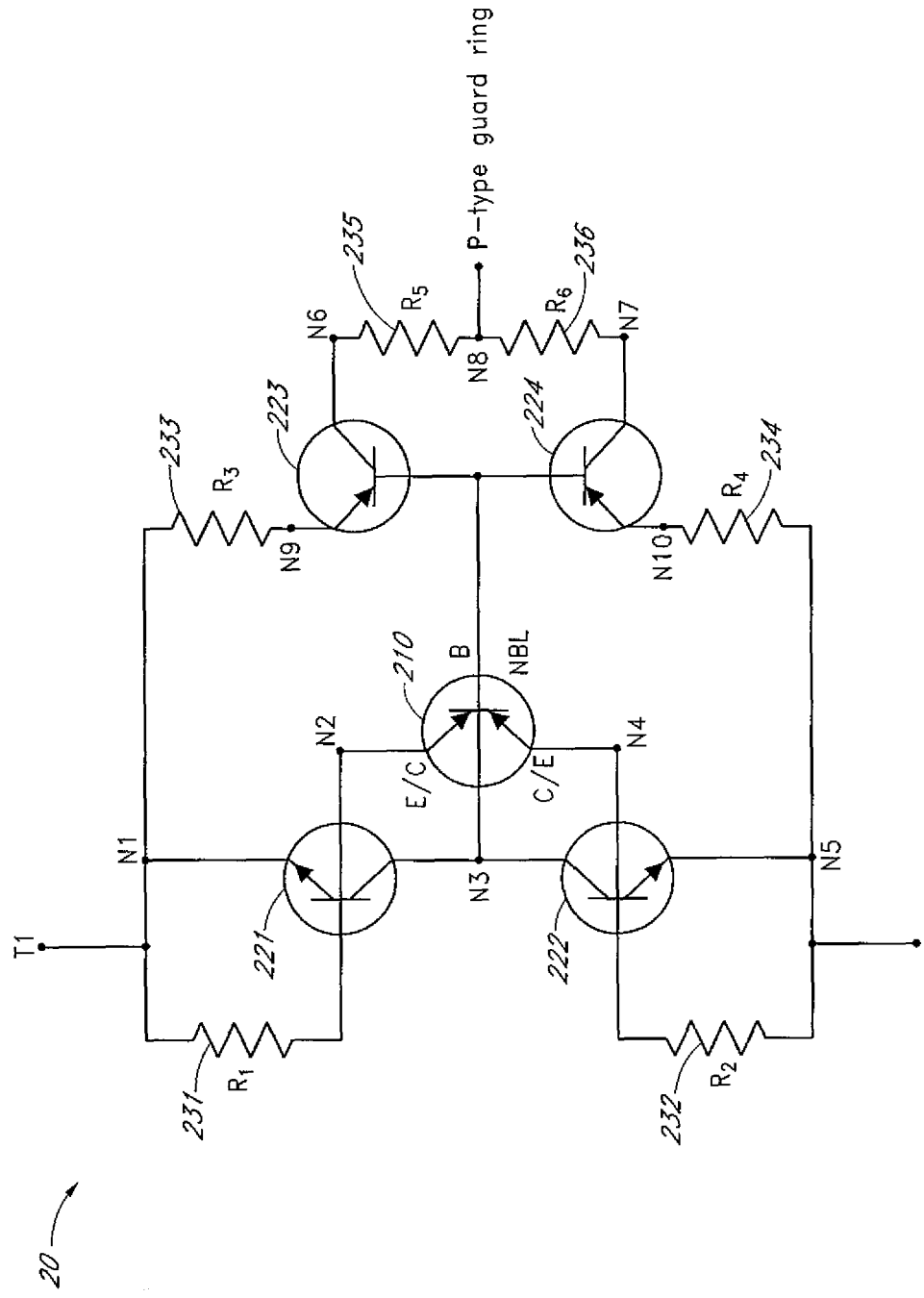
FIG. 2 is a circuit diagram illustrating a bi-directional IC protection circuit according to one embodiment.

FIG. 2 is a circuit diagram of a protection circuit 20 in accordance with one embodiment. The illustrated protection circuit 20 includes first and second terminals T1, T2, a bi-directional bipolar device 210, first to fourth transistors 221-

224, first to sixth resistors 231-236, and first to tenth nodes N1-N10. The protection circuit 20 can be adapted to serve, for example, any of the protection circuits 15a, 15b, 15c of FIG. 1A.

The first and second terminals T1, T2 can be electrically coupled to two pads of an IC such that a current shunt path can be established between the two pads when there is an overvoltage or undervoltage condition. For example, the first terminal T1 can be electrically coupled to the pad 6 of FIG. 1A, and the second terminal T2 can be electrically coupled to the pad 4 of FIG. 1A. The first and second terminals T1, T2 are electrically shorted to the first and fifth nodes N1, N5, respectively.

The bi-directional bipolar device 210 has an emitter/collector E/C electrically coupled to the second node N2, a collector/emitter C/E electrically coupled to the fourth node N4, and a base electrically coupled to the third node N3. The third node N3 can be electrically coupled to a floating N buried layer, as will be described in detail in connection with FIG. 3D. The bi-directional bipolar device 210 can operate bi-directionally as a bipolar transistor, depending on the voltage conditions at the first and second terminals T1, T2.

For example, if a voltage difference from the first terminal T1 to the second terminal T2 (i.e., $V_{T1}-V_{T2}$) is higher (or more positive) than a positive trigger voltage $+V_{TR}$ (see FIG. 1B), the emitter/collector E/C of the bipolar device 210 serves as an emitter, and the collector/emitter C/E of the bipolar device 210 serves as a collector such that the bipolar device 210 operates as a PNP bipolar transistor passing a current therethrough from the second node N2 to the fourth node N4. In contrast, if a voltage difference from the first terminal T1 to the second terminal T2 (i.e., $V_{T1}-V_{T2}$) is lower (or more negative) than a negative trigger voltage $-V_{TR}$ (see FIG. 1B), the emitter/collector E/C of the bipolar device 210 serves as a collector, and the collector/emitter C/E of the bipolar device 210 serves as an emitter such that the bipolar device 210 operates as a PNP bipolar transistor passing a current therethrough from the fourth node N4 to the second node N2.

The first transistor 221 can be an NPN bipolar transistor having an emitter coupled to the first node N1, a collector electrically coupled to the third node N3, and a base electrically coupled to the second node N2. The second transistor 222 can be an NPN bipolar transistor having an emitter coupled to the fifth node N5, a collector electrically coupled to the third node N3, and a base electrically coupled to the fourth node N4.

In the illustrated embodiment, the first and second transistors 221, 222 have limited injection efficiency at their n-p junctions (emitter-base junctions). In such an embodiment, the bipolar device 210 dominates, rather than the first and second transistors 221, 222. The bipolar device 210 can control the response and current discharge of the protection circuit 20 during a bi-directional ESD stress condition.

The third transistor 223 can be a PNP bipolar transistor having an emitter coupled to the first node N1 through the third resistor 233, a collector electrically coupled to the eighth node N8 through the fifth resistor 235, and a base electrically coupled to the third node N3. In one embodiment, the eighth node N8 can be electrically coupled to a p-type guard ring. Similarly, the fourth transistor 224 can be a PNP bipolar transistor having an emitter coupled to the fifth node N5 through the fourth resistor 234, a collector electrically coupled to the eighth node N8 through the sixth resistor 236, and a base electrically coupled to the third node N3. In certain embodiments, the third and fourth transistors 223, 224 can be parasitic transistors formed by portions of the structure of the protection circuit 20. The third and fourth transistor 223, 224 can be referred to as lateral PNP components in the context of this document.

Although not illustrated, the circuit 20 can also include a fifth transistor and a sixth transistor, which can be PNP transistors. The fifth transistor can have an emitter coupled to the first node N1 via a seventh resistor, a based coupled to the third node N3, and a collector coupled to a p-type substrate that can electrically connected to the p-type guard ring. The sixth transistor can have an emitter coupled to the fifth node N5 via an eighth resistor, a based coupled to the third node N3, and a collector coupled to the p-type substrate. Each of the fifth and sixth transistors can be referred to as a vertical PNP component in the context of this document.

The first resistor 231 has a first end electrically coupled to the first node N1, and a second end electrically coupled to the second node N2. The second resistor 232 has a first end electrically coupled to the fifth node N5, and a second end electrically coupled to the fourth node N4. The third resistor 233 has a first end electrically coupled to the first node N1, and a second end electrically coupled to the emitter of the third transistor 223 via the ninth node N9. The fourth resistor 234 has a first end electrically coupled to the fifth node N5, and a second end electrically coupled to the emitter of the fourth transistor 224 via the tenth node N10. The fifth resistor 235 has a first end electrically coupled to the eighth node N5, and a second end electrically coupled to the collector of the third transistor 223 (labeled as a sixth node N6). The sixth resistor 236 has a first end electrically coupled to the eighth node N8, and a second end electrically coupled to the collector of the fourth transistor 224 (labeled as a seventh node N7).

In one embodiment, the first to sixth resistors 231-236 can be implemented by employing the resistivity of n-type or p-type wells to achieve target resistances. The value of the resistors 231-236 can be selected to achieve a turn-on speed and stability desired for a particular application. For example, the resistance of the first and second resistors 231, 232 can be adjusted to provide, along with a generated displacement current (Ix=C·dV/dt), a voltage (Vx=Rx·Ix) build-up to forward-bias the emitter-base junction of the first and second transistors 221, 222, respectively, leading to weak NPN bipolar turn-on and subsequent coupled PNP/NPN activation of the protection I-V characteristics of the circuit 20 for relatively high voltage clamping and stress current discharge. The operation of the protection circuit 20 will be described below in connection with FIG. 3D.

Figure 3A:
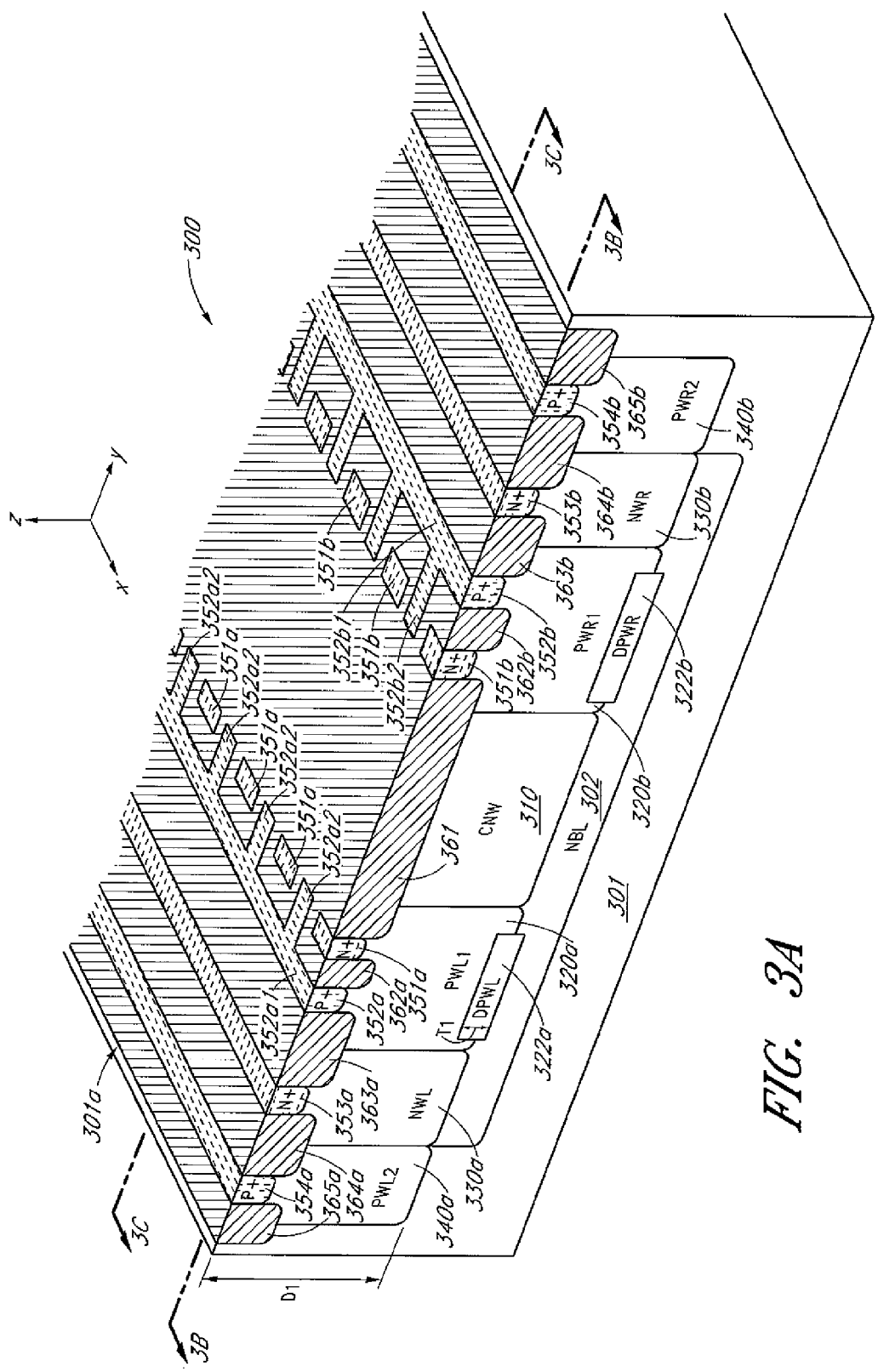
FIG. 3A is a schematic perspective view of a bi-directional IC protection device implementing the IC protection circuit of FIG. 2 according to one embodiment.
Figure 3B:
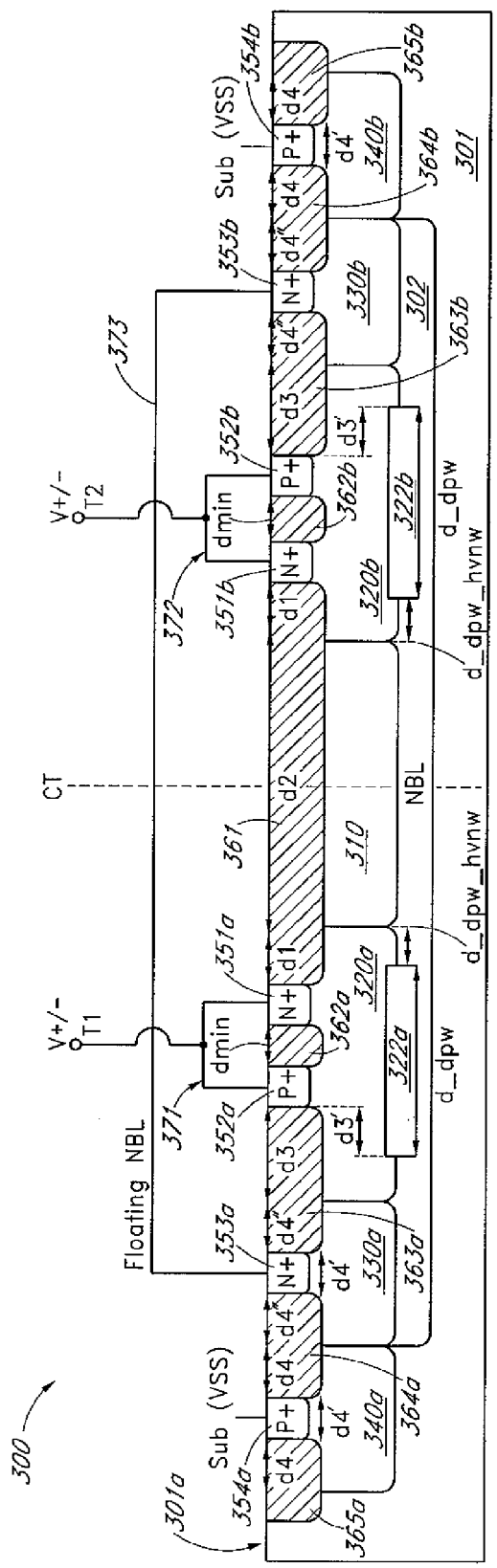
FIG. 3B is a cross section view of the IC protection device of FIG. 3A, taken along the line 3B-3B.
Figure 3C:
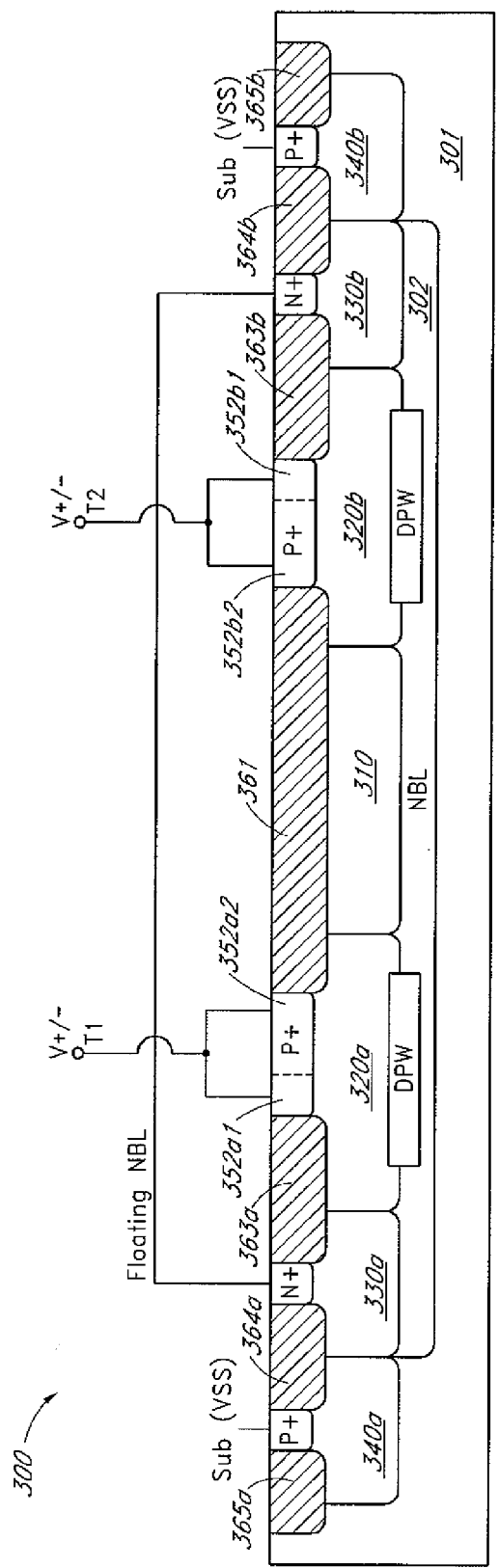
FIG. 3C is a cross section view of the IC protection device of FIG. 3A, taken along the line 3C-3C.

Referring to FIGS. 3A-3C, one implementation of the protection circuit 20 of FIG. 2 will be described below. FIG. 3A is a partial perspective view of a protection device implementing the protection circuit 20 of FIG. 2 according to one embodiment.

In all the embodiments described in this document, a region, a layer, or a well denoted with "N" or "n" can contain n-type dopants, and a region, a layer, or a well denoted with "P" or "p" can contain p-type dopants unless otherwise indicated. Further, "n+," "N+," "p+," and "P+" indicate a higher doping concentration than "n," "N," "p," and "P," respectively. "n," "N," "p," and "P" indicate a higher doping concentration than "n−," "N−," "p−," and "P−," respectively.

In the illustrated embodiment, the protection device 300 is formed in a well of a substrate 301. The substrate 301 can be a p-type substrate. In another embodiment, the substrate can include a p-epitaxial layer formed on a silicon substrate. Although not illustrated, the substrate 301 can also include other devices or ICs formed therein. In some embodiments, the protection device 300 can be insulated from the other devices outside the well on the same monolithic integrated circuit. The protection device 300 can include an N buried layer (NBL) 302 formed on the bottom of the well of the substrate 301. The N buried layer 302 can be electrically floating. While illustrated and described with reference to directions left and right, it will be understood that the directions can be interchanged and can vary based on view.

The protection device 300 can also include a central N well (CNW) 310, a first left P well (PWL1) 320a, a first right P well (PWR1) 320b, a left N well (NWL) 330a, and a right N well (NWR) 330b fanned on the N buried layer 302. The protection device 300 can also include a second left P well (PWL2) 340a and a second right P well (PWR2) 340b formed in the well of the substrate 301 outside a region in which the wells 310, 320a, 320b, 330a, 330b are formed. The second left P well 340a is formed adjacent to the left N well 330a on a portion of the bottom of the well of the substrate 301 with no underlying N buried layer. The second right P well 340b is formed adjacent to the right N well 330b on another portion of the bottom of the well of the substrate 301 with no underlying N-buried layer.

The central N well 310 is interposed laterally between the first left and right P wells 320a, 320b, and contacts lateral surfaces of the first left and right P wells 320a, 320b. The first left P well 320a is interposed laterally between the central N well 310 and the left N well 330a, and contacts lateral surfaces of the central N well 310 and the left N well 330a. The left N well 330a is interposed laterally between the first left P well 320a and the second left P well 340a, and contacts lateral surfaces of the first left P well 320a and the second left P well 340a.

The first right P well 320b is interposed laterally between the central N well 310 and the right N well 330b, and contacts lateral surfaces of the central N well 310 and the right N well 330b. The right N well 330b is interposed laterally between the first right P well 320b and the second right P well 340b, and contacts lateral surfaces of the first right P well 320b and the second right P well 340b. In one embodiment, the depths D1 of the wells 310, 320a, 320b, 330a, 330b, 340a, 340b can be similar to one another, and can range between about 2.5 µm and about 5.5 µm from the top surface 301a of the substrate 301.

The protection device 300 can optionally include a left deep P well (DPWL) 322a interposed vertically between the first left P well 320a and the N buried layer 302, and a right deep P well (DPWR) 322b interposed vertically between the first right P well 320b and the N buried layer 302. In one embodiment, the thicknesses T1 of the deep P wells 322a, 322b can range between about 1.5 µm and about 3.5 µm. The top surfaces of the deep P wells 322a, 322b can be at a vertical level of about 5 µm to about 8 µm from the top surface 301a of the substrate 301. The vertical level can vary, depending on the relative junction depths of the wells 310, 320a, 320b, 330a, 330b, 340a, 340b.

In the illustrated embodiment, the protection device 300 also includes a plurality of first left n+ regions 351a formed in the first left P well 320a, and a plurality of first right n+ regions 351b formed in the first right P well 320b. The first left n+ regions 351a are separated from one another and are aligned in the x direction in FIG. 3A when viewed from above. Similarly, the first right n+ regions 351b are separated from one another and are aligned in the x direction in FIG. 3A when viewed from above.

The protection device 300 also includes a first left p+ region 352a in the first left P well 320a, and a first right p+ region 352b in the first right P well 320b. The first left p+ region 352a can include an elongated portion 352a1 extending in the x direction, and a plurality of protruding portions 352a2 extending in the y direction from the elongated portion 352a1 toward the central N well 310. The elongated portion 352a1 is formed on the left side of the first left n+ regions 351a in FIG. 3A. Each of the protruding portions 352a2 extends in a space between respective two of the first left n+ regions 351a.

Similarly, the first right p+ region 352b can include an elongated portion 352b1 extending in the x direction, and a plurality of protruding portions 352b2 extending in the y direction from the elongated portion 352b1 toward the central N well 310. The elongated portion 352b1 is formed on the right side of the first right n+ regions 351b in FIG. 3A. Each of the protruding portions 352b2 extends in a space between respective two of the first right n+ regions 351b.

In the context of this document, n+ region(s) and p+ region(s) arranged close to each other in the P first wells 320a, 320b can be referred to as "p-n array." The plurality of first left n+ regions 351a and the left p+ region 352a form a left p-n array. The plurality of first right n+ regions 351b and the right p+ region 352b form a right p-n array.

In addition, the protection device 300 includes a second left n+ region 353a formed in the middle of the left N well 330a, and a second right n+ region 353b formed in the middle of the right N well 330b when viewed from above. Each of the second left n+ region 353a and the second right n+ region 353b extends in the x direction. The protection device 300 also includes a second left p+ region 354a formed in the middle of the second left P well 340a, and a second right p+ region 354b formed in the middle of the second right P well 340b when viewed from above. Each of the second left p+ region 354a and the second right p+ region 354b extends in the x direction.

In one embodiment, each of the regions 351a, 351b, 352a, 352b, 353a, 353b, 354a, 354b is formed from a level of the top surface 301a of the substrate 301 to a depth that can be about ⅕ to about ⅖ of a respective one of the wells 320a, 320b, 330a, 330b, 340a, 340b.

The protection device 300 also includes oxide regions 361, 362a, 362b, 363a, 363b, 364a, 364b, each of which fills a region between respective two adjacent ones of the regions 351a, 352a, 353a, 354a, 351b, 352b, 353b, 354b. The protection device 300 also includes outermost oxide regions 365a, 365b formed outside the second left and right p+ regions 354a, 354b. Each of the oxide regions 361, 362a, 362b, 363a, 363b, 364a, 364b, 365a, 365b is formed from a level of the top surface 301a of the substrate 301 to a depth that is deeper than the regions 351a, 351b, 352a, 352b, 353a, 353b, 354a, 354b to provide shallow trench isolation. The depths of the oxide regions 361, 362a, 362b, 363a, 363b, 364a, 364b, 365a, 365b can be about ⅕ to about ⅟₁₅ of a respective one of the wells 310, 320a, 320b, 330a, 330b, 340a, 340b, and can be relatively deeper than the highly doped regions, for example, the regions 351a, 352a, 353a, 354a, 351b, 352b, 353b, 354b.

The protection device 300 can undergo back end processing to form contacts and metallization. Skilled artisans will appreciate that these details have been omitted from this figure for clarity.

FIG. 3B is a cross-section of the protection device 300, taken along the lines 3B-3B. The illustrated cross-section shows various dimensions of the wells, regions, and layers described above in connection with FIG. 3A. In FIG. 3B, the protection device 300 is symmetrical about the central line CT. Thus, dimensions are described below with respect to the left half of the device, but the right half of the device can have the same dimensions.

In FIG. 3B, a first lateral distance d1 represents a lateral distance between the first left n+ region 351a and the central N well 310. A second lateral distance d2 represents a lateral width of the central N well 310. A third lateral distance d3 represents a lateral distance between the first left p+ region 352a and the left N well 330a. A distance labeled as d3' represents a lateral distance between the left side surface of the first left p+ region 352a and the left side surface of the left deep P well 322a in FIG. 3B. A distance labeled as dmin represents a lateral distance between the first left p+ region 352a and the first left n+ region 351a. A fourth lateral distance d4 represents a lateral distance between the second left p+ region 354a and the left N well 330a or between the second left p+ region 354a and the left side surface of the second left P well 340a. A distance labeled as d4' represents a width of each of the second left n+ region 353a and the second left p+ region 354a. A distance labeled as d4" represents a lateral distance between the second left n+ region 353a and the first left P well 320a or between the second left n+ region 353a and the second left P well 340a. A distance labeled as d_dpw represents a lateral width of the left deep P well 322a. A distance labeled as d_dpw_hvnw represents a distance between the left deep P well 322a and the central N well 310. Example values of the distances d1-d4" and dmin are shown in Table 1 below. A skilled artisan will appreciate that these values can vary widely, depending on the particular applications and desired parameters such as holding voltages, trigger voltages, and/or operating voltages.

TABLE 1

| | Distance |
|---|---|
| d1 | About 3 μm to about 5 μm, for example, 4 μm |
| d2 | about 10 μm to about 45 μm, for example, 20 μm for a holding voltage of above 25 V, or 35 μm for a holding voltage of above 40 V |
| d3 | About 6 μm to about 8 μm, for example, 6.5 μm |
| d3' | About 1 μm to about 4 μm, for example, 3.5 μm |
| dmin | About 0 μm to about 1.2 μm, for example, 0.5 μm |
| d4 | About 3.5 μm to about 7 μm, for example, 4 μm |
| d4' | About 0.5 μm to about 2 μm, for example, 1.85 μm |
| d4" | About 4 μm to about 15 μm, for example, 5 μm |
| d_dpw | About 3 μm to about 8 μm, for example, 7.7 μm |
| d_dpw_hvnw | About 0 μm to about 1.5 μm, for example, 1 μm |

Referring back to FIGS. 2 and 3B, in one embodiment, the first lateral distance d1 can affect the base formation of the first and second NPN transistors 221, 222. The first lateral distance d1 can be changed to adjust the bipolar gain and electron injection efficiency of the first and second transistors 221,222. A larger gain can be obtained with a smaller distance.

The second lateral distance d2 can be closely related to the base formation of the bipolar device 210. The second lateral distance d2 can be changed to modify the gain of the bipolar device 210. As the second lateral distance d2 increases, the gain is lowered, while increasing the holding voltage obtained in the circuit 20 upon activation.

The third lateral distance d3 and the distance d4" can be changed to reduce the bipolar gain and electron injection efficiency of the third and fourth bipolar transistors 223, 224. The distance d3' can define the extension of the deep P well 322a, 322b beyond the boundary of the p+ region 352a defined by controllable manufacturing considerations. The distance d_dpw can also be defined by manufacturing considerations and by the total footprint taken by the different 'dmin' distance and the p-n array formation 351a, 352a, 351b, 352b.

The distance dmin relates to the first and second resistors 231, 232 (FIG. 2). As the distance dmin is increased, the resistance can be proportionally increased. The distance 'd_dpw_hvnw' relates to the definition of the device blocking junction. A lower blocking voltage can be obtained with a smaller spacing.

The inclusion of the deep P wells 322a, 322b can create a vertical junction with the highly doped N buried layer 302, and the junction can be used to adjust the breakdown to enhance protection of the sensitive integrated circuit devices. The distance d4' can define a contact in the outermost regions of the device 300. Along with the distance d4, the contact can be configured to reduce bipolar action to the substrate 301 as well as undesirable interaction of the device 300 with surrounding devices on the same substrate, by collecting majority carriers injected into the common substrate.

FIG. 3B also shows that the protection device 300 has a first conductive line 371 electrically connecting the first left n+ region 351a and the first left p+ region 352a, and a second conductive line 372 electrically connecting the first right n+ region 351b and the first right p+ region 352b. The first and second conductive lines 371 are electrically coupled to a first terminal T1 and a second terminal T2, respectively. The protection device 300 also has a third conductive line 373 electrically connecting the second left n+ region 353a to the second right n+ region 353b. The second p+ regions 354a, 354b can be electrically coupled to a voltage reference, such as VSS or ground.

FIG. 3C is another cross-section of the protection device 300, taken along the lines 3C-3C. The structure of the device 300 shown in the cross-section of FIG. 3C is the same as the structure shown in the cross-section of FIG. 3B except that FIG. 3C shows the protruding portions 352a2, 353b2 of the first p+ regions 352a, 352b and no first n+ regions 351a, 351b.

Figure 3D:
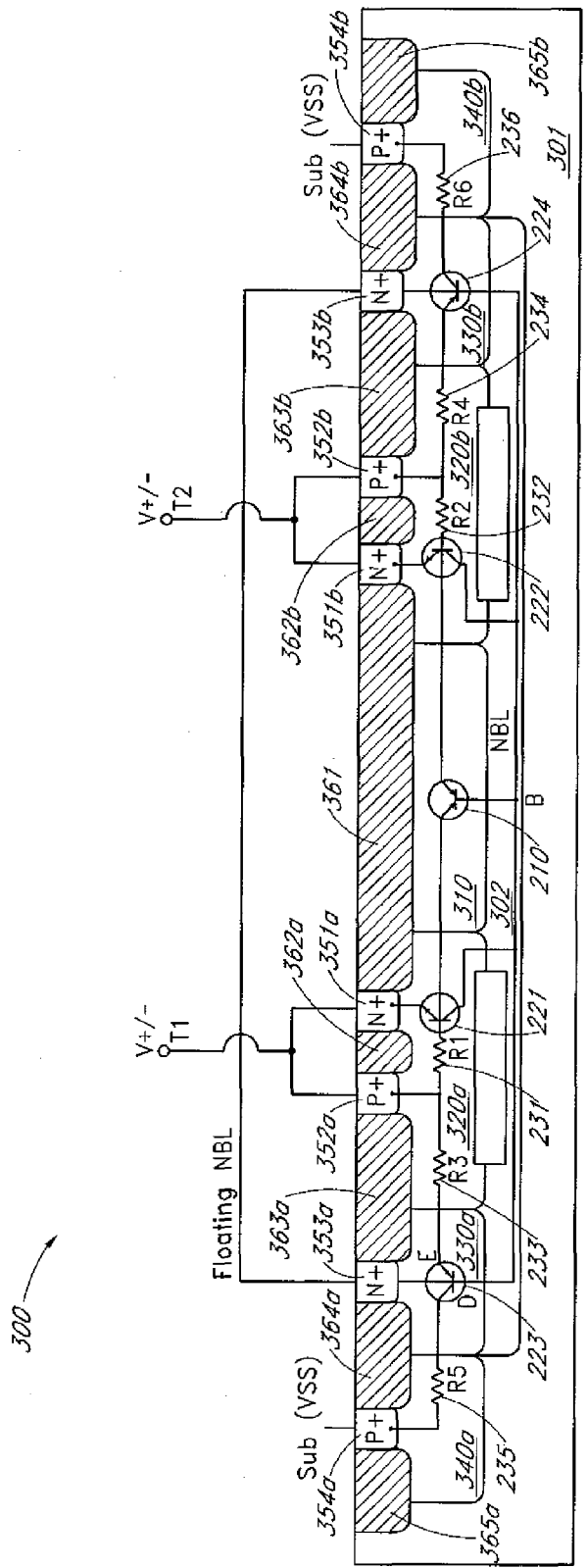
FIG. 3D is an annotated cross section view of the IC protection device of FIG. 3A, taken along the line 3B-3B.

Referring to FIGS. 2 and 3D, a circuit implemented in the protection device 300 according to one embodiment will be described below. In the protection device 300, a bi-directional bipolar device equivalent to the bipolar device 210 of FIG. 2 is formed in the central N well 310 with an emitter/collector coupled to the first left P well 320a, a collector/emitter coupled to the first right P well 320b, and a base coupled to the N buried layer 302.

A first transistor 221 equivalent to the first transistor 221 of FIG. 2 is formed in the first left P well 320a with an emitter coupled to the first left n+ regions 351a, a collector coupled to the N buried layer 302, and a base coupled to the first left p+ region 352a through a first resistor 231 formed in the first left P well 320a. A second transistor 222 equivalent to the second transistor 222 of FIG. 2 is formed in the first right P well 320b with an emitter coupled to the first right n+ regions 351b, a collector coupled to the N buried layer 302, and a base coupled to the first right p+ region 352b through a second resistor 232 formed in the first right P well 320b.

A third transistor 223 equivalent to the third transistor 223 of FIG. 2 is formed in the left N well 330a with an emitter coupled to the first left p+ regions 352a through a third resistor 233 formed in the first left P well 320a, a collector coupled to the second left p+ region 354a through a fifth resistor 235 formed in the left N well 330a and the second left P well 340a, and a base coupled to the N buried layer 302 and the second left n+ region 353a. A fourth transistor 224 equivalent to the fourth transistor 224 of FIG. 2 is formed in the right N well 330b with an emitter coupled to the first right p+ regions 352b through a fourth resistor 234 formed in the first right P well 320b, a collector coupled to the second right p+ region 354b through a sixth resistor 236 formed in the right N well 330b and the second right P well 340b, and a base coupled to the N buried layer 302 and the second right n+ region 353b.

Although not illustrated, the device 300 can have a vertical PNP component. The vertical component can have an emitter coupled to the first left p+ regions 352a through a seventh resistor formed in the first left P well 320a, a collector coupled to the p-type substrate 301, and a base coupled to the N buried layer 302. Similarly, the device 300 can have another vertical PNP component having an emitter coupled to the first right p+ regions 352b through an eighth resistor formed in the first right P well 320b, a collector coupled to the substrate 301, and a base coupled to the N buried layer 302.

During operation, when a voltage difference from the first terminal T1 to the second terminal T2 ($V_{T1}$-$V_{T2}$) is higher (or more positive) than a positive trigger voltage +$V_{TR}$ (see FIG. 1B), the first transistor 221 can operate similar to a forward-biased base-collector diode in series with the first resistor 231. The first resistor 231 can serve as a conductivity-modulated resistor. At that point, the device 300 enters a high injection condition with the PNP transistor 210 (the bipolar device 210 is turned into a PNP bipolar transistor) and the NPN transistor 222 upon being turned on. The trigger voltage is dominated by the blocking junction formed from the central N well 310 and the N buried layer 302 to the first right deep P well 322b and the first right P well 320b.

The bipolar device 210 operates as a PNP bipolar transistor passing a current from the first p+ (emitter) region 352a via the first left P well 320a (the first resistor 231). The minority carriers (holes) current flows through the first right P well 320b to the first right p+ (collector) region 352b. At the same time, the second bipolar transistor 222 is weakly turned on, achieving a high injection condition with the PNP transistor 210 and the NPN transistor 222. The high injection condition is dominated by the PNP action and the current in the device 300 flows from the N buried layer (collector) 302 to the first right n+ (emitter) regions 351b.

In contrast, if a voltage difference from the first terminal T1 to the second terminal T2 ($V_{T1}$-$V_{T2}$) is lower (or more negative) than a negative trigger voltage -$V_{TR}$ (see FIG. 1B), the second transistor 222 operates similar to a forward-biased base-collector diode in series with the second resistor 232 that serves as a conductivity-modulated resistor. At that point, the device 300 enters a high injection condition with the PNP transistor 210 and the NPN transistor 221 upon being turn-on. The trigger voltage is dominated by the blocking junction formed from the central N well 310 and the N buried layer 302 to the first left deep P well 322a and the first left P well 320a.

The bipolar device 210 operates as a PNP bipolar transistor passing a current from the first p+ (emitter) region 352b via the first right P well 320b (the second resistor 232). The minority carriers (holes) current flows through the first left P well 320a to the first left p+ (collector) region 352a. At the same time, the first bipolar transistor 221 is weakly turned on, achieving a high injection condition with the PNP transistor 210 and the NPN transistor 221. The high injection condition is dominated by the PNP action and the current in the device 300 flows from the N buried layer (collector) 302 to the first left n+ emitter regions 351a.

In one embodiment, the protection device 300 can have a trigger voltage of about +/-(40-70) V, a direct-current (DC) blocking voltage in the range of +/-(40-75) V, and an absolute holding voltage of greater than 25 V (|+/-25| V), typically in the range of 45 to 55 V and up to greater than 60V. The maximum transient TLP stress current handling capability per unit area (Fm=Imax/Area) ratio can be changed and increased for the corresponding operating condition, with Imax proportionally higher for lower holding voltage operation embodiments. For example, for an embodiment with an absolute TLP (200-ps rise time/100-ns pulse width) quasi-static trigger voltage ($V_T$) in the range of 58 V and a holding voltage ($V_H$) in the range of 48 V, the ratio Fm≈0.15 mA/μm², this translates in this embodiment to about 0.034 mm² footprint to handle an Imax>5 A. For example, the protection device 300 can provide internal circuit protection against an ESD in the typical range of 2000 to 8000 V ESD stress condition while reducing the required protection device footprint.

Figure 4:
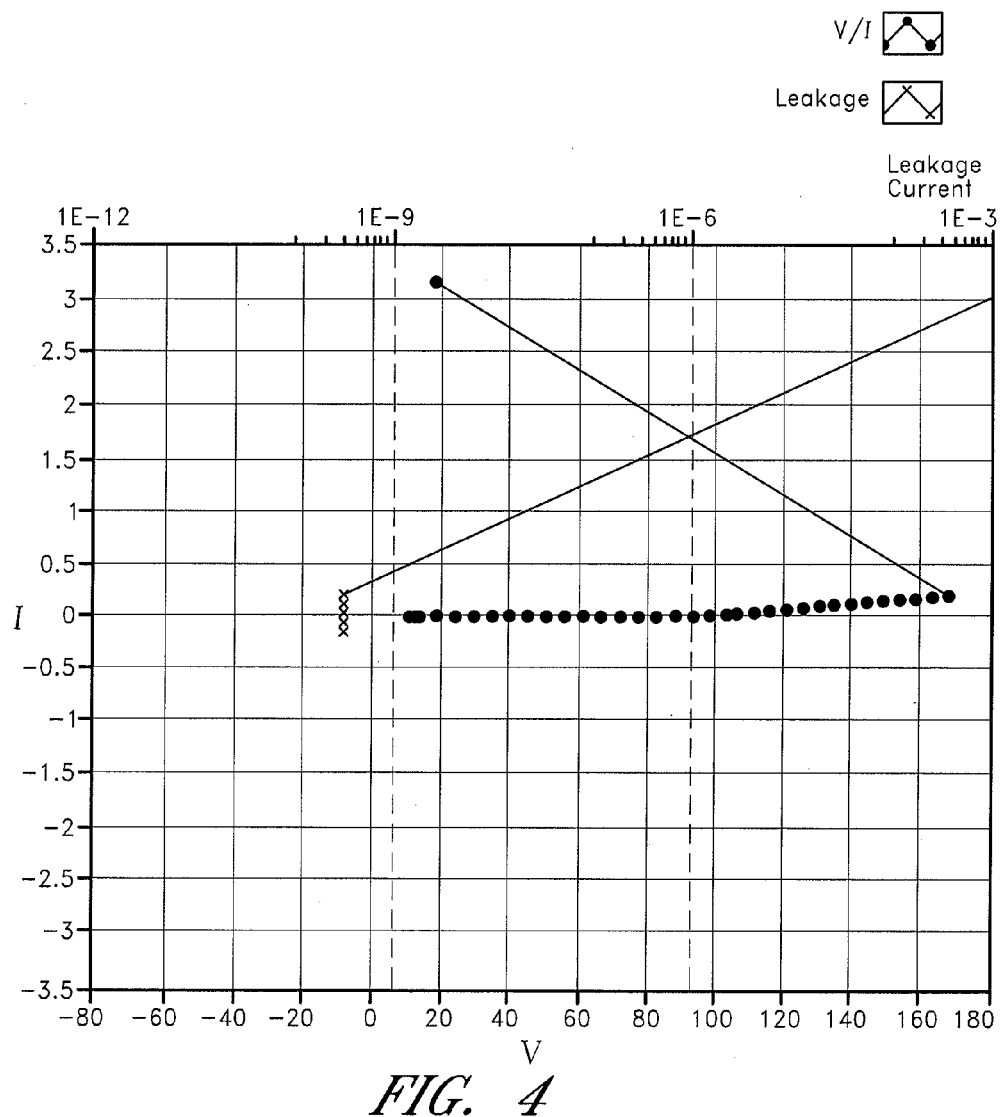
FIG. 4 is a graph showing a relationship between current and voltage, resulting from the transmission line pulse (TLP) quasi-static measurement of a parasitic PNP bipolar device in the protection device of FIG. 3B or 3D.

The PNP transistors 223, 224 are formed in the device 300 in an open-base configuration. Even though they do not participate in the main operation and definition of the I-V characteristics of the protection device 300, the presence of these transistors also needs to be carefully considered while adjusting the different spacing and implant to avoid undesirable triggering of conduction paths to the semiconductor substrate or surrounding implant regions when the device is integrated on-chip. FIG. 4 shows a graph resulting from a transmission line pulse (TLP) breakdown current-voltage (I-V) measurement of the third or fourth transistor 223, 224. In the measurement, a leakage test voltage of 75.00 V, a leakage current limit of 1.00E-4 A, a maximum pulse voltage of 250.00 V, a start pulse voltage of 5.00 V, a test step voltage of 0.50 V, a pulse current limit of 3.50 A, a pulse width of 100 ns, and pulse rise time of 0.200 ns were used. The graph shows that the transistors 223, 224 break down at a voltage substantially larger than the operating region of interest (for example, below 80 V) and a relatively high resistance is achieved after the breakdown. This indicates that the transistors 223, 224, which can be parasitic, do not adversely affect the operation of the protection device 300.

Figure 5A:
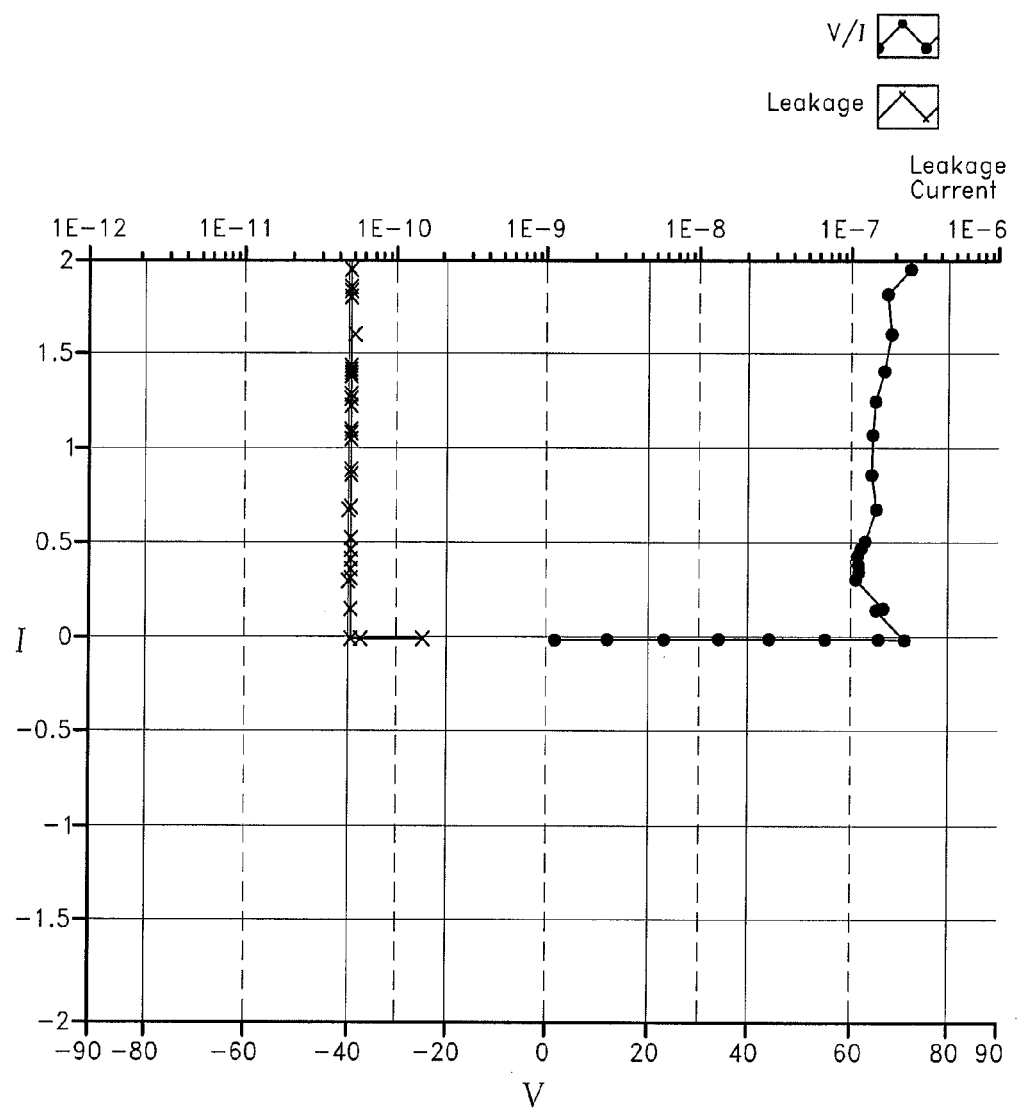
FIG. 5A is a graph showing a relationship between current and voltage of the protection device of FIG. 3B, resulting from the TLP quasi-static measurement during a positive ESD stress.
Figure 5B:
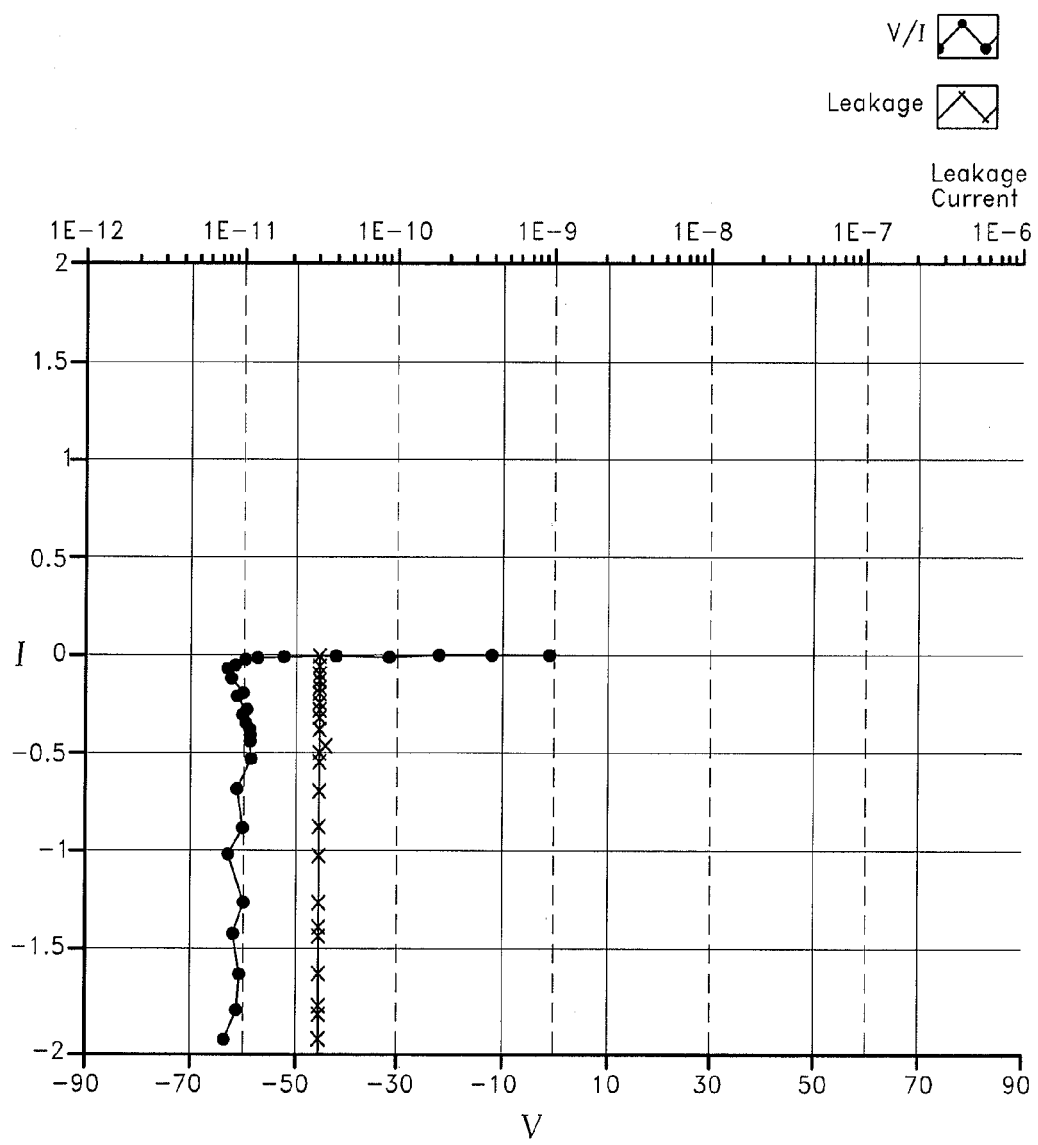
FIG. 5B is a graph showing a relationship between current and voltage of the protection device of FIG. 3B, resulting from the TLP quasi-static measurement during a negative ESD stress.

FIG. 5A shows a graph resulting from an example TLP measurement of a protection device according to one embodiment when there is a positive polarity ESD event and a $V_T$≈70V/$V_H$>60V is obtained. In the measurement, a leakage test voltage of 55.00 V, a leakage current limit of 1.00E-4 A, a maximum pulse voltage of 250.00 V, a start pulse voltage of 0.50 V, a test step voltage of 0.50 V, a pulse current limit of 2.00 A, a pulse width of 100 ns, and pulse rise time of 10.0 ns were used. FIG. 5B shows a graph resulting from an example TLP measurement of the protection device according to one embodiment when there is a negative ESD event. In the measurement, a leakage test voltage of -55.00 V, a leakage current limit of 1.00E-4 A, a maximum pulse voltage of -250.00 V, a start pulse voltage of -0.50 V, a test step voltage of -0.50 V, a pulse current limit of -2.00 A, a pulse width of 100 ns, and pulse rise time of 10.0 ns were used. The protection device in this particular example is configured to sustain >+/-2000 V ESD stress condition and for systems operating below +/-40 to 60 V during normal operation or false conditions as those obtained in automotive environment applications.

Figures 6A, 6B:
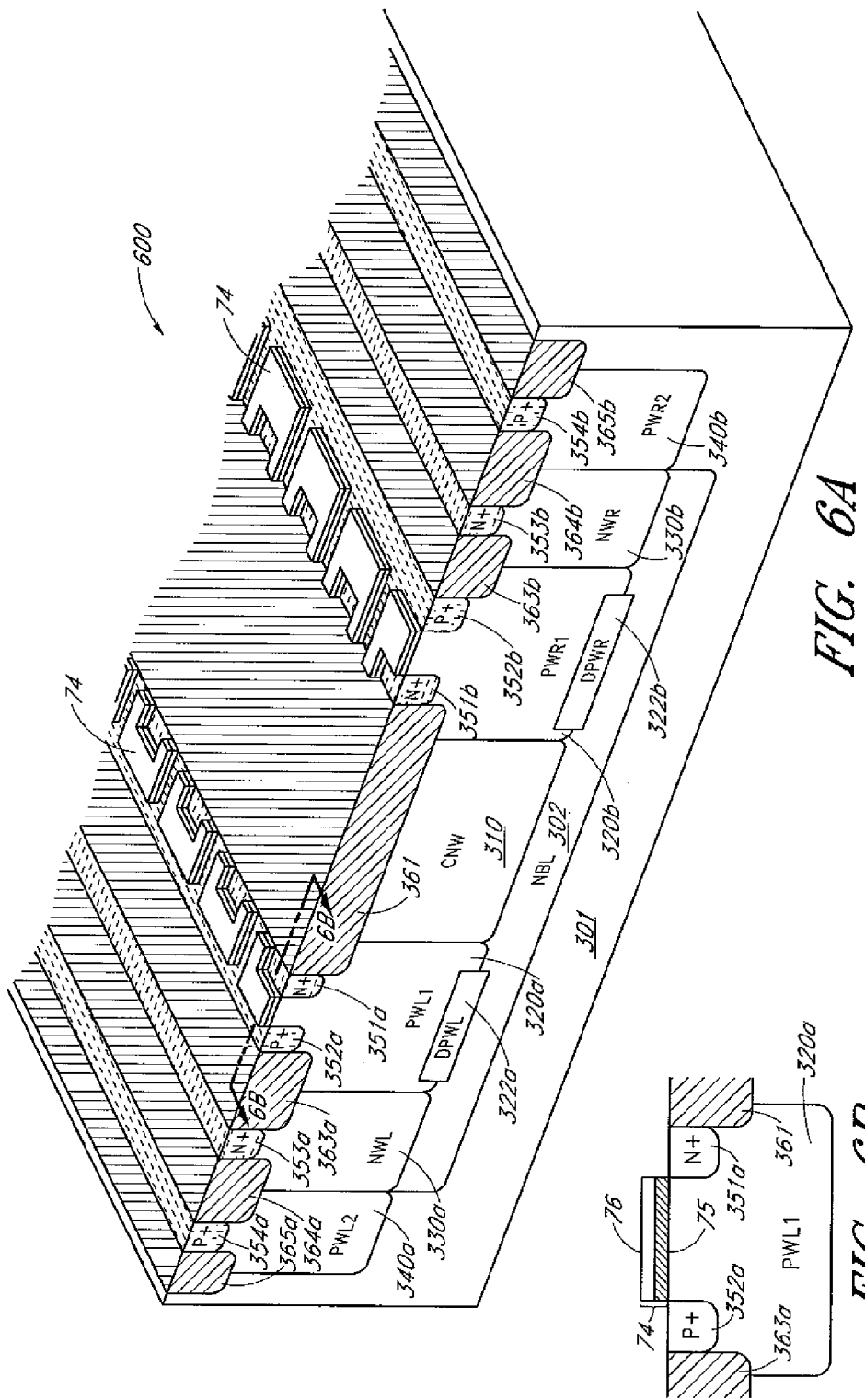
FIG. 6A is a schematic perspective view of an IC protection device according to another embodiment.
FIG. 6B is a partial cross section view of the IC protection device of FIG. 6A, taken along the line 6B-6B.

Referring now to FIGS. 6A and 6B, another implementation of the protection circuit 20 of FIG. 2 will be described below. The protection device 600 is formed in a well of a substrate 301 that is part of a substrate assembly. Although not illustrated, the substrate 301 can also include other devices or ICs formed therein. In some embodiment, the protection device 300 can be insulated from the other devices outside the well on the same monolithic integrated circuit. The protection device 600 can include an N buried layer (NBL) 302 formed on the bottom of the well of the substrate 301.

The protection device 600 can also include a central N well (CNW) 310, a first left P well (PWL1) 320a, a first right P well (PWR1) 320b, a left N well (NWL) 330a, a right N well (NWR) 330b, a second left P well (PWL2) 340a, a second right P well (PWR2) 340b, a left deep P well (DPWL) 322a, and a right deep P well (DPWR) 322b. The configurations of the wells 310, 320a, 320b, 330a, 330b, 340a, 340b, 322a, 322b can be as described above in connection with the wells 310, 320a, 320b, 330a, 330b, 340a, 340b, 322a, 322b of FIG. 3A.

The protection device 600 can further include first left n+ regions 351a, first right n+ regions 351b, a first left p+ region 352a, a first right p+ region 352b, a second left n+ region 353a, a second right n+ region 353b, a second left p+ region 354a, a second right p+ region 354b. The configurations of the regions 351a, 351b, 352a, 352b, 353a, 353b, 354a, 354b can be as described above in connection with the regions 351a, 351b, 352a, 352b, 353a, 353b, 354a, 354b of FIG. 3A.

Similar to the protection device 300, the protection device 600 can include oxide regions 361, 363a, 363b, 364a, 364b, 365a, 365b that are the same as the oxide regions 361, 363a, 363b, 364a, 364b, 365a, 365b of FIG. 3A. However, the protection device 600 does not include oxide regions between the first left n+ regions 351a and the first left p+ region 352a, or between the first right n+ regions 351b and the first right p+ region 352b.

As shown in FIGS. 6A and 6B, the protection device 600 includes masking stacks 74, each of which includes a dummy gate oxide layer 75 and a dummy gate electrode 76 formed on top of the dummy gate oxide layer 75. The stacks 74 are formed on regions between the first left n+ regions 351a and the first left p+ region 352a, and between the first right n+ regions 351b and the first right p+ region 352b. The stacks 74 also extend over regions between adjacent two of the first left n+ regions 351a and between adjacent two of the first right n+ regions 351b.

During fabrication, the stacks 74 are formed before the n+ regions and p+ regions 351a, 351b, 352a, 352b, 353a, 353b, 354a, 354b are formed by, for example, implanting dopants. The stacks serve as a mask for implanting the first n+ regions and first p+ regions 351a, 351b, 352a, 352b such that the adjacent n+ regions and p+ regions are formed to not contact each other and have an explicit gap therebetween. In connection with FIG. 2, the explicit gaps allow fine adjustment of the resistances of the first and second resistors 231, 232.

Figure 7:
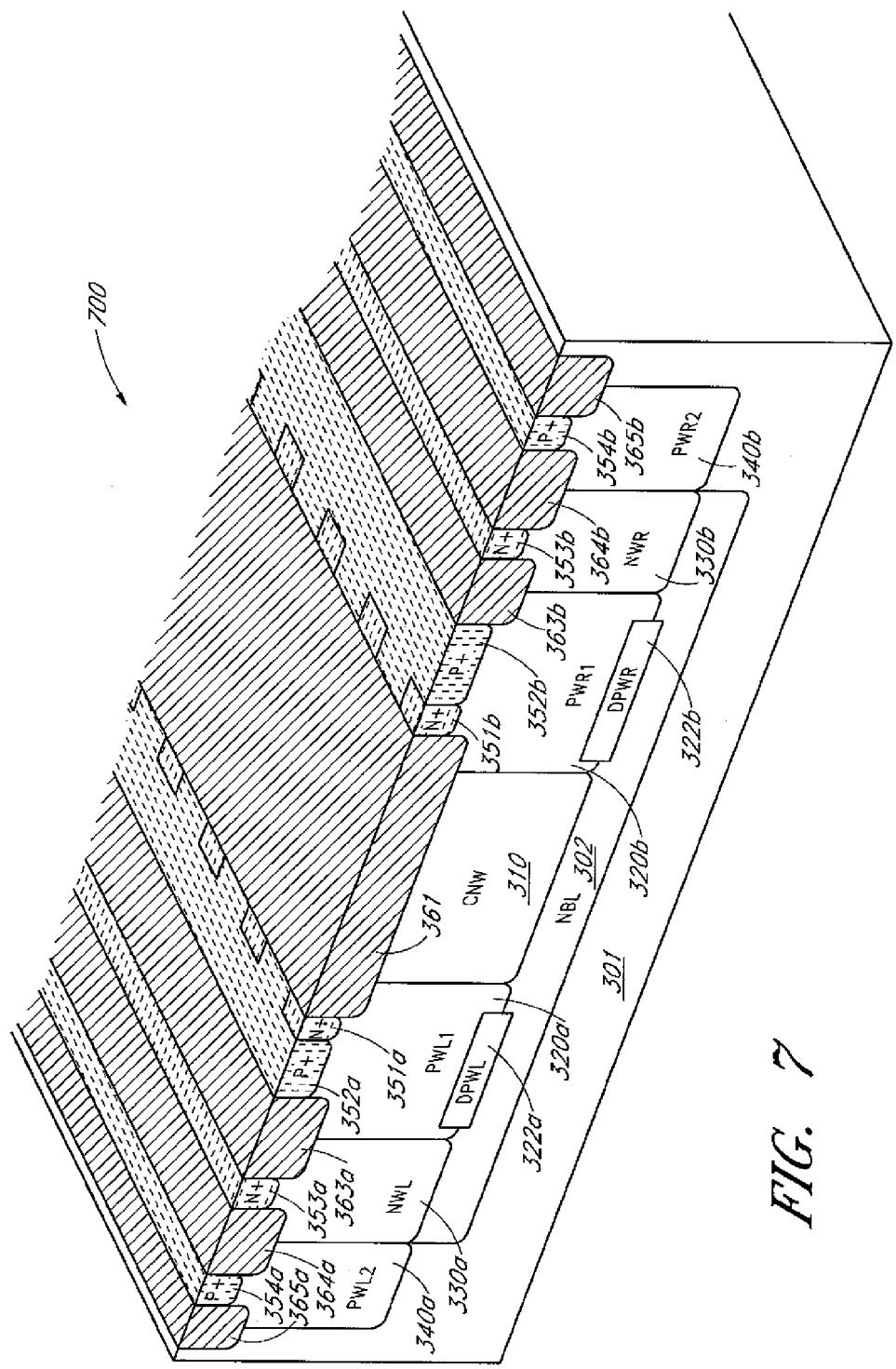
FIG. 7 is a schematic perspective view of an IC protection device according to yet another embodiment.

Referring now to FIG. 7, yet another implementation of the protection circuit 20 of FIG. 2 will be described below. The protection device 700 is formed in a well of a substrate 301. Although not illustrated, the substrate 301 can also include other devices or ICs formed therein. In some embodiment, the protection device 300 can be insulated from the other devices outside the well on the same monolithic integrated circuit. The protection device 700 can include an N buried layer (NBL) 302 formed on the bottom of the well of the substrate 301.

The protection device 700 can also include a central N well (CNW) 310, a first left P well (PWL1) 320a, a first right P well (PWR1) 320b, a left N well (NWL) 330a, a right N well (NWR) 330b, a second left P well (PWL2) 340a, a second right P well (PWR2) 340b, a left deep P well (DPWL) 322a, a right deep P well (DPWR) 322b, first left n+ regions 351a, first right n+ regions 351b, a first left p+ region 352a, a first right p+ region 352h, a second left n+ region 353a, a second right n+ region 353b, a second left p+ region 354a, and a second right p+ region 354b.

The configurations of the foregoing wells and regions can be the same as those described in connection with those of FIG. 3A except that the first left n+ regions 351a and the first left p+ region 352a abut each other with no gap therebetween, and that the first right n+ regions 351b and the first right p+ region 352b abut each other with no gap therebetween.

Similar to the protection device 300, the protection device 700 can also include oxide regions 361, 363a, 363b, 364a, 364b, 365a, 365b that are the same as the oxide regions 361, 363a, 363b, 364a, 364b, 365a, 365b of FIG. 3A. However, the protection device 700 does not include oxide regions between the first left n+ regions 351a and the first left p+ region 352a, or between the first right n+ regions 351b and the first right p+ region 352b as there are no gaps therebetween. Such a configuration allows for: 1) smaller footprint in the lateral direction, 2) direct contact at the silicon surface via silicide in Salicide processes, 3) adjusting the resistances of the first and second resistors 231, 232 described in connection with FIG. 2 to desirable levels for cases in which relatively highly resistive/lightly doped well are used for the first left P well (PWL1) 320a and the first right P well (PWR1) 320b regions, which can be common in relatively high voltage application manufacturing processes.

Figure 8A:
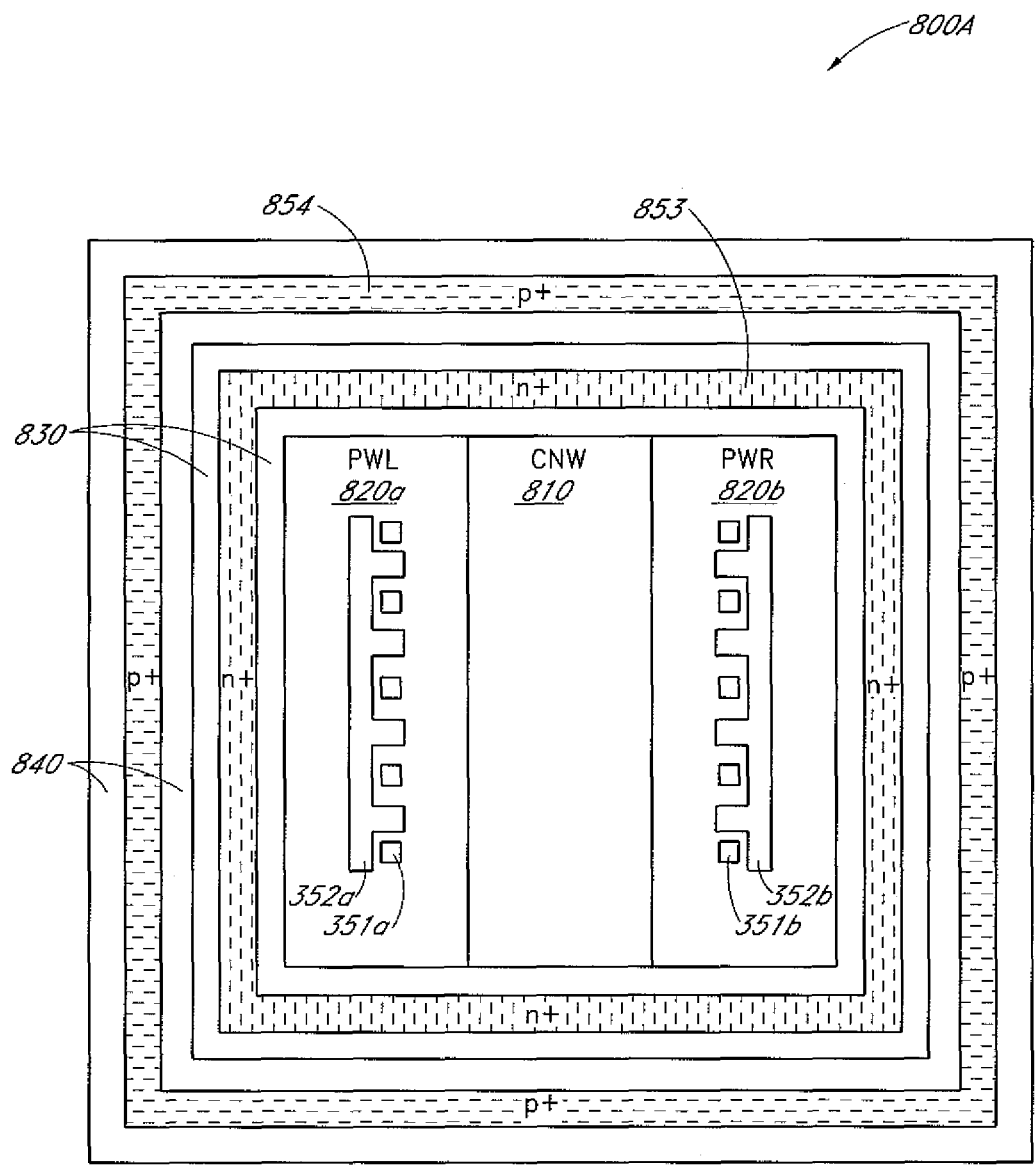
FIG. 8A is a schematic top plan view of an IC protection device according to yet another embodiment.

Referring to FIG. 8A, a protection device according to one embodiment will be described below. FIG. 8A is a top plan view of the protection device 800A. The illustrated protection device 800A includes a central N well 810, a left P well 820a, and a right P well 820b that can correspond to the central N well 310, the first left P well 320a, and the first right P well 320b, respectively. The illustrated protection device 800A also includes an N well ring 830 which can correspond to the left and right N wells 330a, 330b of FIG. 3A. The protection device 800A also includes a P well ring 840 which can correspond to the second left and right P wells 340a, 340b of FIG. 3A. In FIG. 8A, oxide regions, such as 361, 362a, 362b, 363a, 363b, 364a, 364b, 365a, 365b shown in FIG. 3A, are omitted for the sake of explanation of the wells.

The protection device 800A also includes first n+ regions 351a, 351b, and first p+ regions 352a, 352b in the left P well 820a and the right P well 820b. While the first n+ regions 351a, 351b and the first p+ regions 352a, 352b are shown to have configurations the same as those shown in FIG. 3A, the regions 351a, 351b, 352a, 352b can have other configurations, such as those shown in FIGS. 6A, 6B, and 7.

In addition, the protection device 800A includes an n+ ring 853 in the N well ring 830, and a p+ ring 854 in the P well ring 840. Other details of the components of the protection device 800A can be as described above in connection with FIGS. 3A-3D.

Figure 8B:
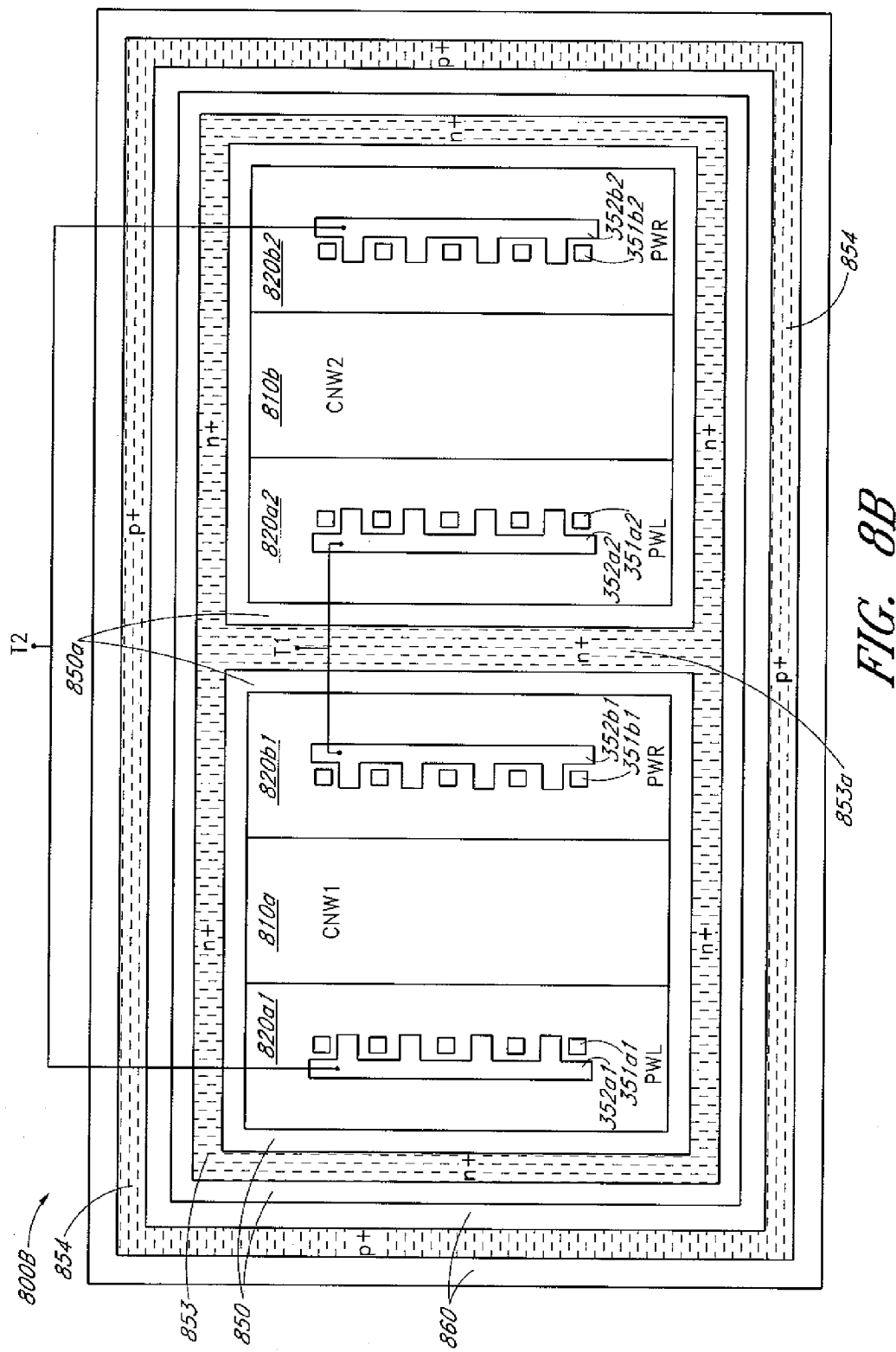
FIG. 8B is a schematic top plan view of an IC protection device according to yet another embodiment.

Referring to FIG. 8B, a protection device according to another embodiment will be described below. FIG. 8B is a top plan view of the protection device 800B. The illustrated protection device 800B includes first and second central N wells 810a, 810b, a first left P well 820a1, a first right P well 820b1, a second left P well 820a2, and a second right P well 820b2. Each of the first and second central N wells 810a, 801b can correspond to the central N well 310 of FIG. 3A. Each of the first left P well 820a1 and the second right P well 820b2 can correspond to the first left P well 320a of FIG. 3A. Each of the first right P well 820b1 and the second left P well 820a2 can correspond to the first right P well 320b of FIG. 3A.

The illustrated protection device 800B also includes an N well ring 850 which can correspond to the left and right N wells 330a, 330b of FIG. 3A. In one embodiment, the N well ring 850 surrounds the entire region in which the first and second central N wells 810a, 801b, the first left P well 820a1, the first right P well 820b1, the second left P well 820a2, and the second right P well 820b2 are formed. The N well ring 850 also includes an optional portion 850a that extends between the first right P well 820b1 and the second left P well 820a2 when viewed from above, as shown in FIG. 8B.

The protection device 800B also includes a P well ring 860 which can correspond to the second left and right P wells

340a, 340b of FIG. 3A: In one embodiment, the P well ring 860 surrounds the entire region in which the first and second central N wells 810a, 801b, the first left P well 820a1, the first right P well 820b1, the second left P well 820a2, the second right P well 820b2, and the N well ring 850 are formed. In FIG. 8B, oxide regions, such as 361, 362a, 362b, 363a, 363b, 364a, 364b, 365a, 365b shown in FIG. 3A, are omitted for the sake of explanation of the wells.

The protection device 800B also includes first n+ regions 351a1, 351b1, 351a2, 351b2, and first p+ regions 352a1, 352b1, 352a2, 352b2 in the left P wells 820a1, 820a2 and the right P wells 820b1, 820b2. While the first n+ regions 351a1, 351b1, 351a2, 351b2 and the first p+ regions 352a1, 352b1, 352a2, 352b2 are shown to have configurations the same as those shown in FIG. 3A, the regions 351a1, 351b1, 351a2, 351b2, 352a1, 352b1, 352a2, 352b2 can have other configurations, such as those shown in FIGS. 6A, 6B, and 7.

In addition, the protection device 800B includes an n+ ring 853 extending in the N well ring 850, and a p+ ring 854 extending in the P well ring 860. The n+ ring 853 can optionally include a portion 853a extending in the portion 850a of the N well ring 850. Other details of the components of the protection device 800A can be as described above in connection with FIGS. 3A-3D.

In one embodiment, the n-p arrays in the P wells 820b1, 820a2 can be electrically coupled to a signal I/O pad, which can receive a signal moving above and below a power reference. The n-p arrays in the P wells 820a1, 820b2 can be electrically coupled to a voltage reference, such as ground.

Referring to FIGS. 9A and 9B, a protection device according to yet another embodiment will be described below. FIG. 9A is a top plan view of the protection device 900. FIG. 9B is an enlarged view of a portion of the protection device 900 of FIG. 9A.

The illustrated protection device 900 is in an octagonal shape. A skilled artisan will, however, appreciate that the protection device 900 can have a different shape when viewed from above, such as a hexagonal shape or a circular shape.

The protection device 900 includes a middle N well (MNW) 930a, a first P well ring (PW1) 920a laterally surrounding the middle N well 930a, a first N well ring (NW1) 910 laterally surrounding the first P well ring 920a, a second P well ring (PW2) 920b laterally surrounding the first N well ring 910, a second N well ring (NW2) 930b laterally surrounding the second P well ring 920b, and a third P well ring (PW3) 940 laterally surrounding the second N well ring 930b.

The middle N well 930a may correspond to the left N well 330a of FIG. 3A. The first P well ring 920a and a second P well ring 920b may correspond to the first left P well 320a and the first right P well 320b, respectively, of FIG. 3A. The first N well ring 910 may correspond to the central N well 310 of FIG. 3A. The second N well ring 930b and the third P well ring 940 may correspond to the right N well 330b and the second right P well 340b, respectively, of FIG. 3A.

The protection device 900 also includes first n+ regions 351a, 351b, and first p+ regions 352a, 352b aligned in the first and second P well rings 920a, 920b, as shown in FIG. 9B. While the first n+ regions 351a, 351b and the first p+ regions 352a, 352b are shown to have configurations the same as those shown in FIG. 3A, the regions 351a, 351b, 352a, 352b can have other configurations, such as those shown in FIGS. 6A, 6B, and 7. In FIG. 9, oxide regions, such as 361, 362a, 362b, 363a, 363b, 364b, 365b shown in FIG. 3A, are omitted for the sake of explanation of the wells. Other details of the components of the protection device 900 can be as described above in connection with FIGS. 3A-3D. In one embodiment, the protection device 900 can be used to increase the current conduction radiating in all the directions through the different sides of the device 900, adjusting the effective junction perimeter for a relatively higher TLP current handling capability, compared to the devices 800A and 800B of FIGS. 8A and 8B (for example, larger than 8000 V Human Body Model (HBM) ESD stress and TEC-61000-4-2-type high stress conditions).

Figure 10A:
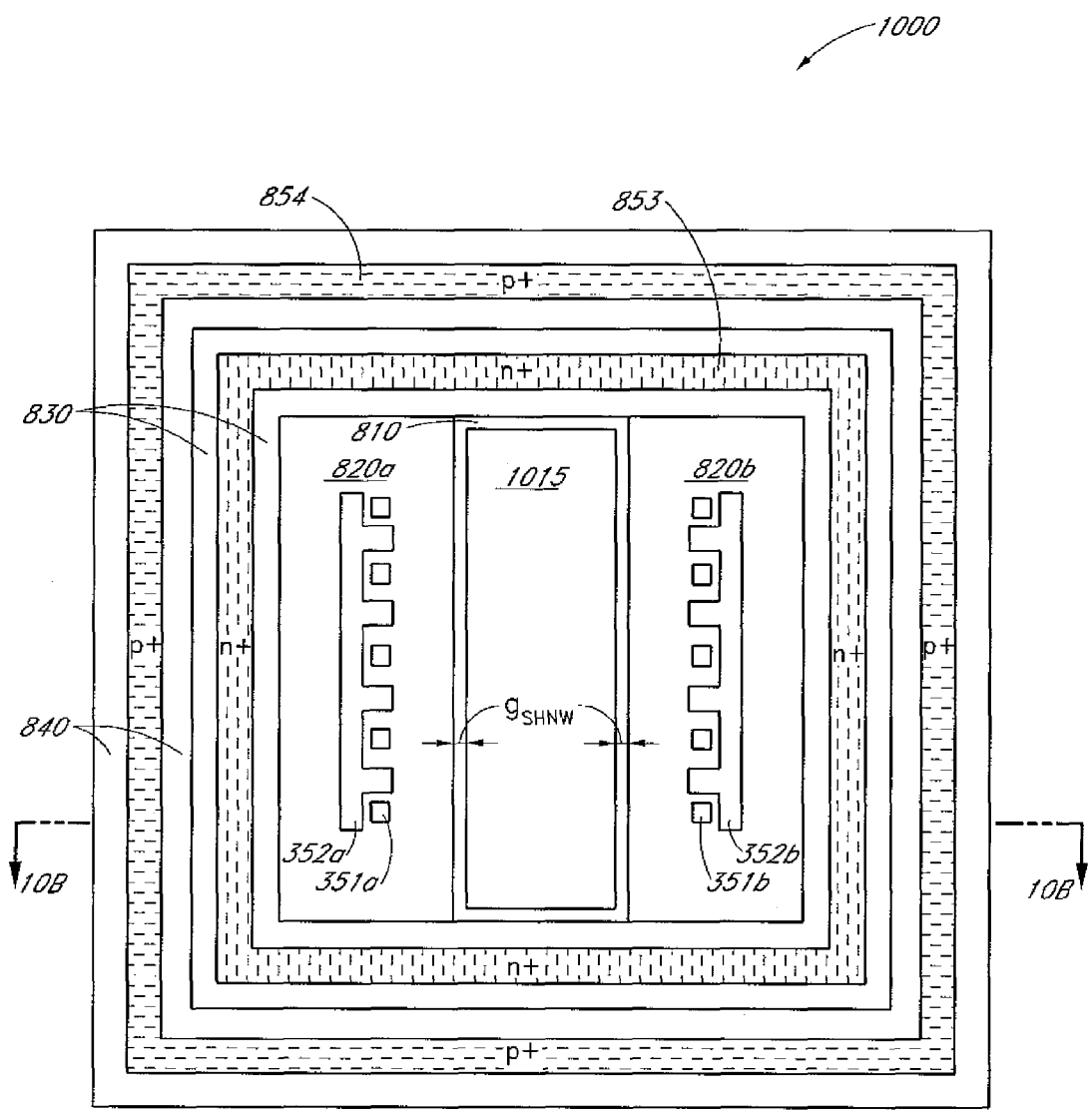
FIG. 10A is a schematic top plan view of an IC protection device having a shallow N well according to yet another embodiment.
Figure 10B:
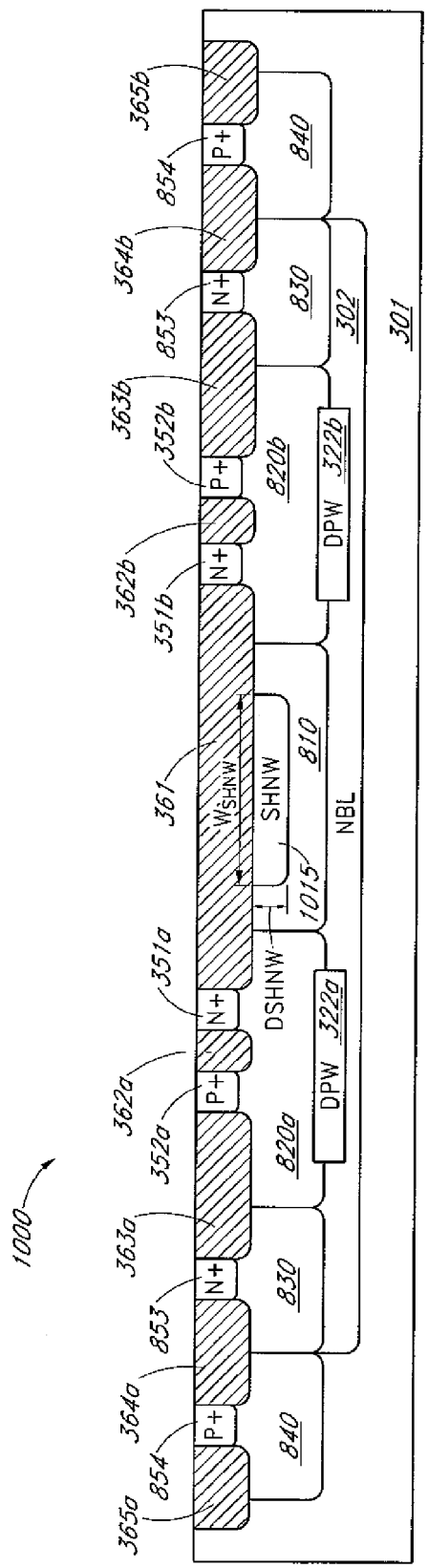
FIG. 10B is a cross section view of the IC protection device of FIG. 10A, taken along the line 10B-10B.

Referring to FIGS. 10A and 10B, a protection device according to yet another embodiment will be described below. FIG. 10A is a top plan view of the protection device 1000. FIG. 10B is a cross section of the protection device 1000 of FIG. 10A, taken along the line 10B-10B.

The configuration of the protection device 1000 is the same as that of the protection device 800A of FIG. 8A except that the protection device 1000 includes a shallow N well 1015 in the central N well 810. The shallow N well 1015 has a higher doping concentration than that of the central N well 810. In one embodiment, the peak doping concentration can be located close to the substrate top-surface, and the diffusion into the substrate and away from the top-surface can be less concentrated. The shallow N well 1015 has a higher doping concentration than that of the central N well 810. The shallow N well 1015 serves to control the turning on of the bipolar device 210 (see FIG. 2) by adjusting the doping concentration of the base of the bipolar device 210. In FIG. 10A, oxide regions, such as 361, 362a, 362b, 363a, 363b, 364a, 364b, 365a, 365b shown in FIG. 3A, are omitted for the sake of explanation of the wells.

Figure 10C:
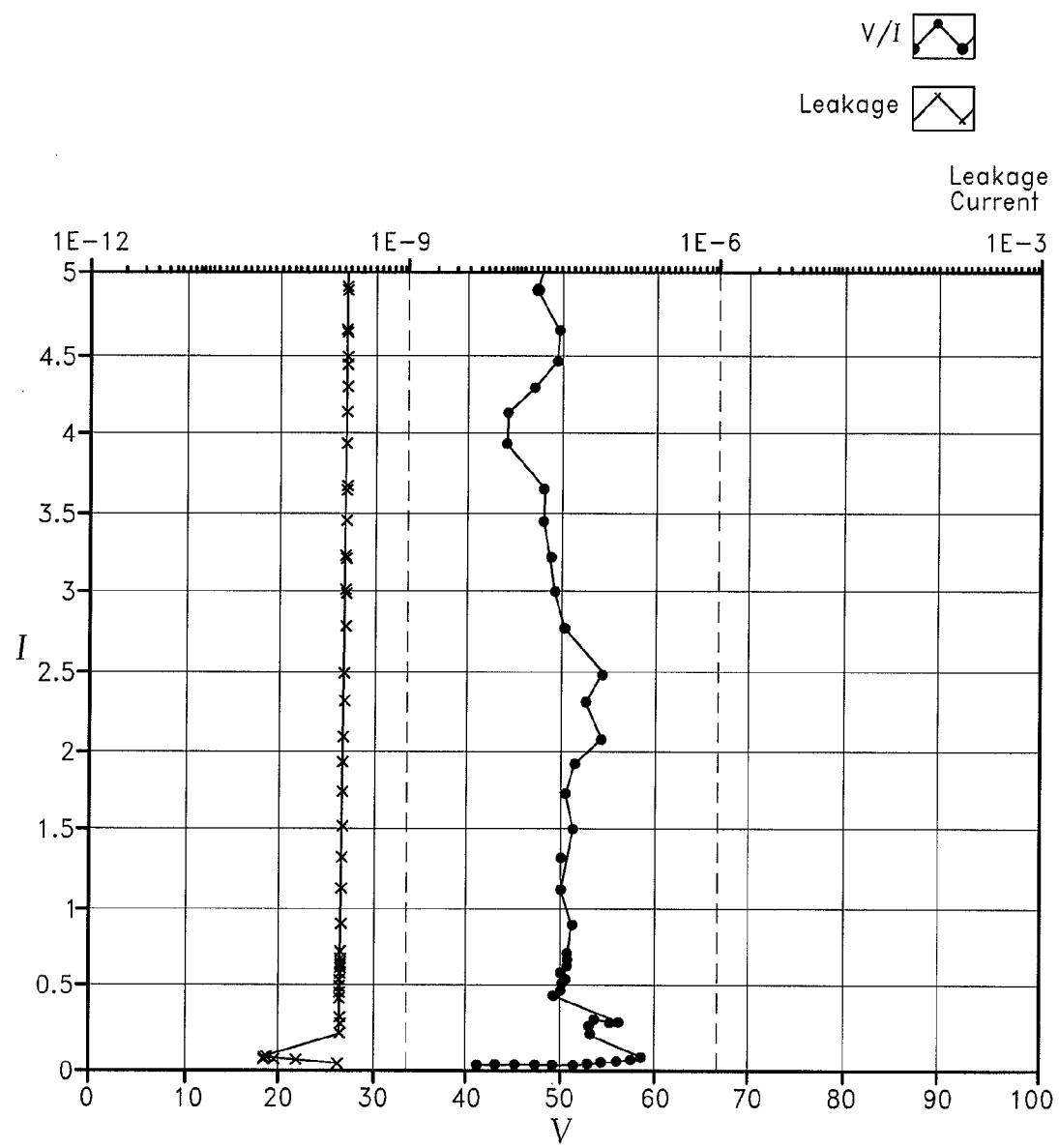
FIG. 10C is a graph showing a relationship between current and voltage of the device of FIG. 10A, resulting from the TLP quasi-static measurement during a positive ESD stress. Symmetrical TLP current and voltage characteristics are obtained in this embodiment for a negative ESD stress.

The shallow N well 1015 can be formed to occupy a substantial portion of the central N well 810 when viewed from above, as shown in FIG. 10A. In one embodiment, the shallow N well 1015 can have a gap $g_{SHNW}$ of about 0 µm to about 2 µm with the adjacent P wells 820a, 820b, and a width $W_{SHNW}$ of about 10 µm to about 45 µm. The shallow N well 1015 is formed below the central oxide region 361 to have a depth DSHNW of about 0.2 µm to about 1 µm (of about 1 µm to about 3 µm from the top surface). This implant is relatively deeper than the highly doped regions p+, n+ and the oxide isolation formation, but shallower than the relative junction depth of the wells 310, 320a, 320b, 330a, 330b, 340a, 340b, as shown in FIG. 10B. Other details of the components of the protection device 1000 can be as described above in connection with FIGS. 3A-3D and 8A. FIG. 10C shows a graph resulting from an example TLP measurement of the protection device of FIGS. 10A and 10B when there is a positive polarity ESD event. In the measurement, a leakage test voltage of 45.00 V, a leakage current limit of 5.00E-4 A, a maximum pulse voltage of 250.00 V, a start pulse voltage of 20.00 V, a test step voltage of 1.00 V, a pulse current limit of 5.00 A, a pulse width of 100 ns, and pulse rise time of 0.200 ns were used. This device was designed to sustain an Imax>5 A and it was achieved by using a protection device with an approximate area footprint of 0.03 mm².

Figure 11A:
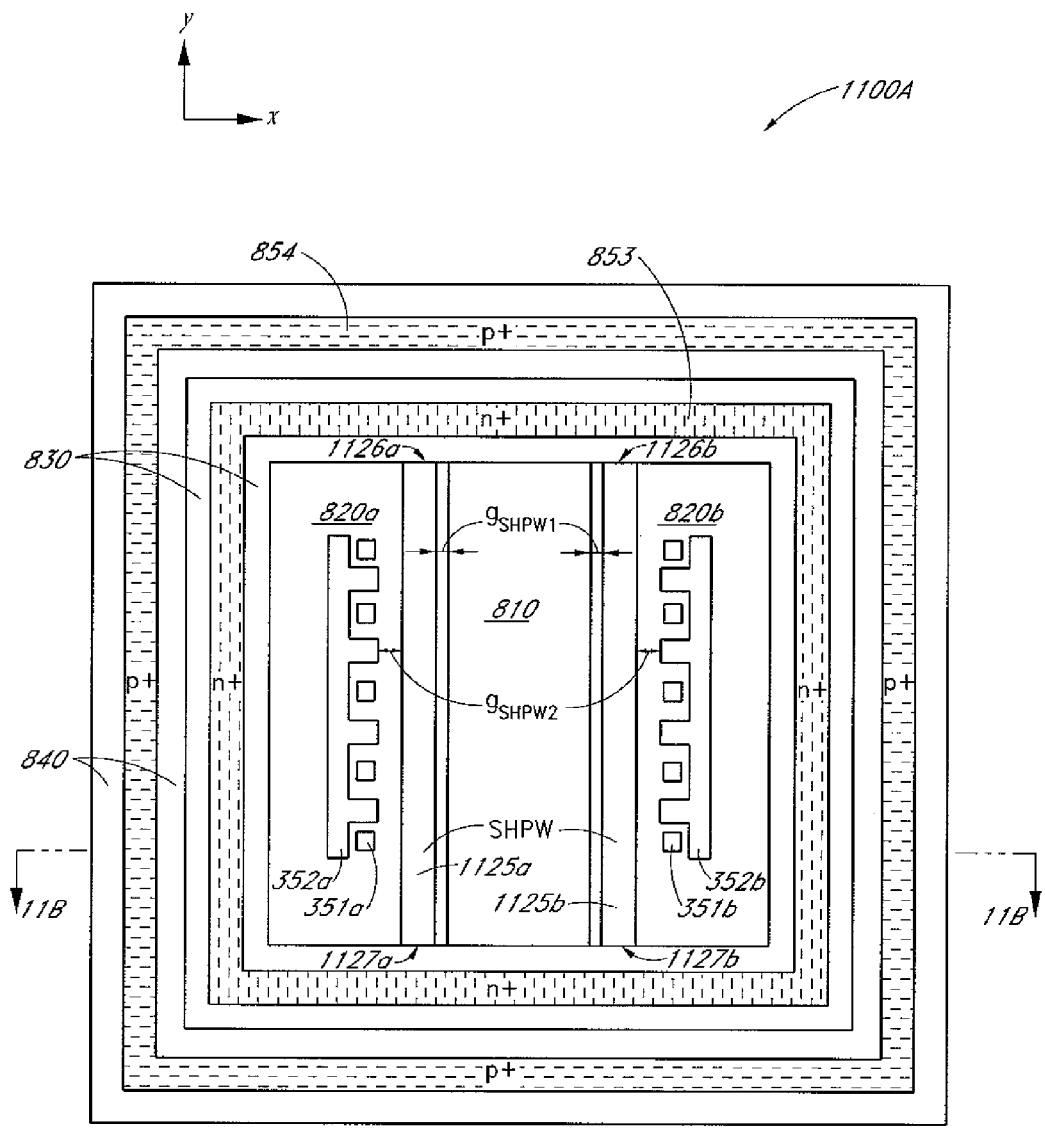
FIG. 11A is a schematic top plan view of an IC protection device having a shallow P well according to yet another embodiment.
Figure 11B:
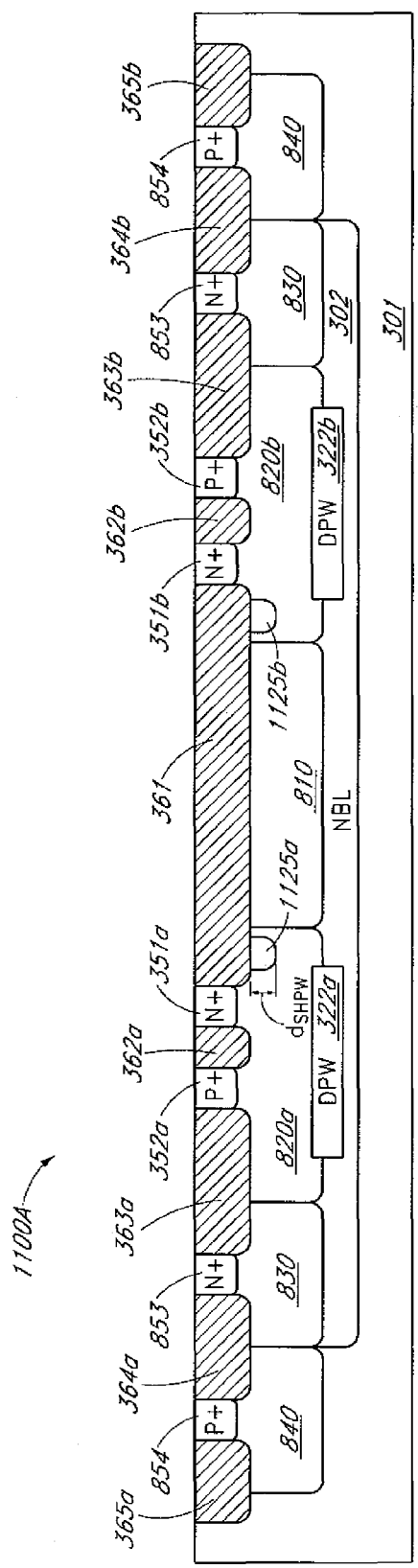
FIG. 11B is a cross section view of the IC protection device of FIG. 11A, taken along the line 11B-11B.

Referring to FIGS. 11A and 11B, a protection device according to yet another embodiment will be described below. FIG. 11A is a top plan view of the protection device 1100A. FIG. 11B is a cross section of the protection device 1100A of FIG. 11A, taken along the line 11B-11B.

The configuration of the protection device 1100A is the same as that of the protection device 800A of FIG. 8A except that the protection device 1100A includes a left shallow P well 1125a in the first left P well 820a, and a right shallow P well 1125b in the first right P well 820b. The shallow P wells 1125a, 1125b have a higher doping concentration than those of the first left and right P wells 820a, 820b. In one embodiment, the peak doping concentration can be located close to the substrate top-surface, and the diffusion into the substrate and away from the top-surface can be less concentrated. This shallow well floating region increases the doping concentration close to the blocking junction and provides an alternative punch-through induced trigger control.

The left shallow P well 1125a extends in the y direction in a region between the p-n array 351a, 352a and the central N well 810 when viewed from above. The left shallow P well 1125a can be formed leaving some space away from the N well ring or to contact the N well ring 830 at its two ends 1126a, 1127a. Similarly, the right shallow P well 1125b extends in the y direction in a region between the p-n array 351b, 352b and the central N well 810 when viewed from above. The right shallow P well 1125b can be formed leaving some space away from the N well ring or formed to contact the N well ring 830 at its two ends 1126b, 1127b.

The shallow P wells 1125a, 1125b can have a first gap $g_{SHPW1}$ of about 0 μm to about 2 μm with the central N well 810. The shallow P wells 1125a, 1125b can have a second gap $g_{SHPW2}$ of about 0.5 μm to about 3.5 μm with the n+ regions 351a, 351b. The shallow P wells 1125a, 1125b are formed below the central oxide region 361 to have a depth $d_{SHNW}$ of about 0.2 μm to about 1 μm (of about 1 μm to about 3 μm from the top surface). This implant is relatively deeper than the highly doped regions p+, n+ and the oxide isolation formation, but shallower than the relative junction depth of the wells 310, 320a, 320b, 330a, 330b, 340a, 340b, as shown in FIG. 11B. In FIG. 11A, oxide regions, such as 361, 362a, 362b, 363a, 363b, 364a, 364b, 365a, 365b shown in FIG. 3A, are omitted for the sake of explanation of the wells. Other details of the components of the protection device 1100A can be as described above in connection with FIGS. 3A-3D and 8A During operation, the shallow P wells 1125a, 1125b serve to facilitate punch-through effect by providing a greater amount of charge carriers (p-type mobile carriers or holes) than without the shallow P wells. This configuration facilitates more current flow between the P wells 820a, 820b and the central N well 810, that is, at the emitter/collector of the bipolar device 210 (FIG. 2). Thus, when there is an ESD event, a better current conductivity is achieved than without the shallow P wells. Further, the shallow P wells 1125a, 1125b allow finer tuning of the breakdown voltage and/or trigger voltage of the device to lower voltage operating conditions than without the shallow P wells, and enhancing the flexibility and robustness of the protection device for applications and manufacturing processes in which there is a very small window for the device operation between the application operating voltage and the voltage at which the core circuit devices fail ($V_F$), see FIG. 1B.

Figure 11C:
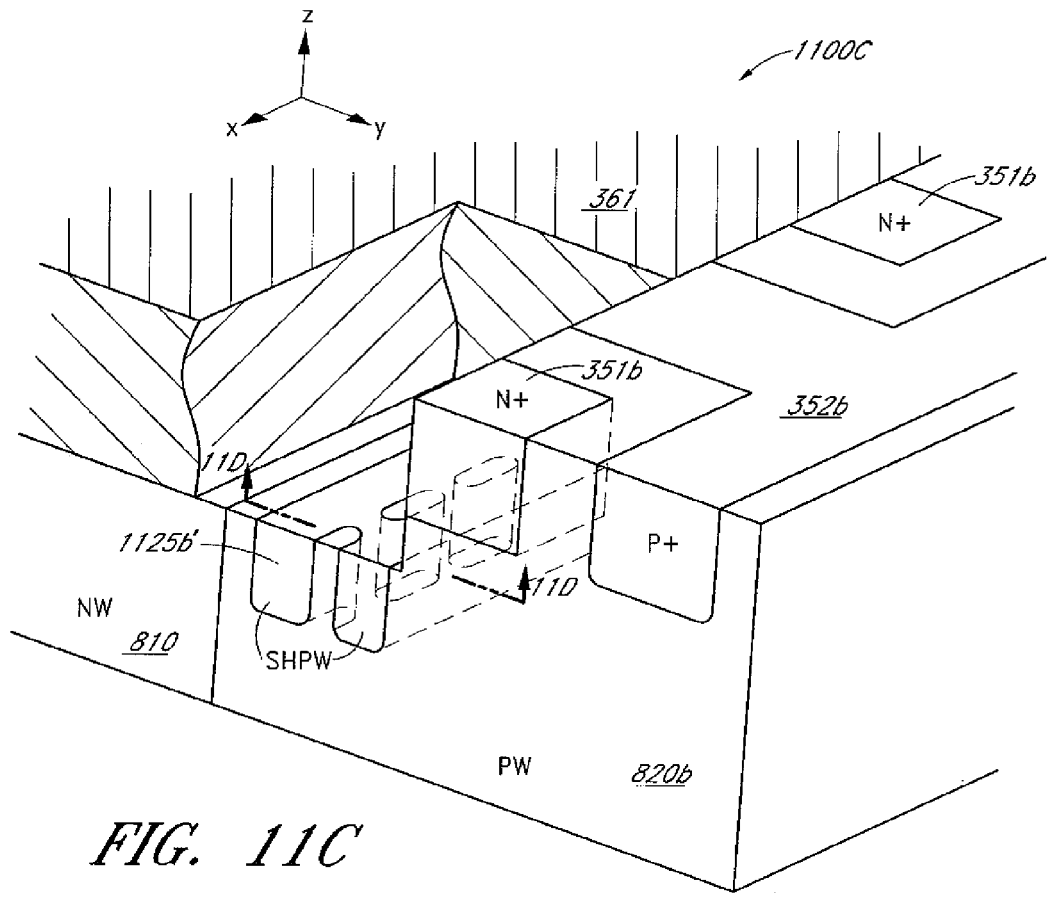
FIG. 11C is a schematic partial perspective view of an IC protection device according to another embodiment.
Figure 11D:
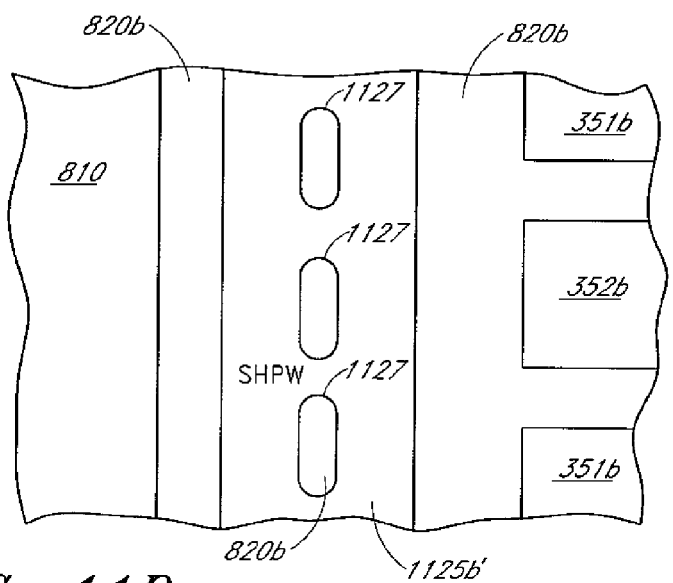
FIG. 11D is a partial cross section view of the IC protection device of FIG. 11C, taken along the line 11D-11D.

Referring to FIGS. 11C and 11D, a protection device including shallow P wells 1125a, 1125b according to another embodiment will be described below. The embodiment of FIGS. 11C and 11D can be a modified implementation of the embodiment of FIGS. 11A and 11B. FIG. 11C is a partial enlarged perspective view of a portion of the protection device 1100C, and FIG. 11D is a partial planar top-view of the device 1100C, taken along the perspective region delimited by line 11D-11D.

The configuration of the protection device 1100C of FIG. 11C is the same as that of the protection device 1100A except that the shallow P wells have mask through-holes which can be defined using different geometrical shapes, for instance ovals (as shown in the figure), squares, circles, or other suitable shape supported by the manufacturing process. The portion illustrated in FIGS. 11C includes a central N well 810, a central oxide region 361, a first right P well 820b, first n+ regions 351b, a first p+ region 352b, and a right shallow P well 1125b'. A portion on the other side of the central N well 810 can also have a symmetrical or asymmetrical structure.

The right shallow P well 1125b' has a plurality of through-holes 1127 (FIG. 11D) formed vertically and aligned in the x-direction along the middle portion of the right shallow P well 1125b'. The through-holes 1127 are filled with the same material (with the same dopant concentration) as the right P well 820b.

The shallow P wells 1125b' region with the through-holes 1127 have a lower net doping concentration than that of a shallow P well without such through-holes. By selecting the size and/or number of the through holes 1127, the net doping concentration of the shallow P wells 1125b' region is further modified without manufacturing process change and the breakdown characteristics of the protection device 1100 can consequently be further fine tuned to narrow device operation design window.

Figure 12A:
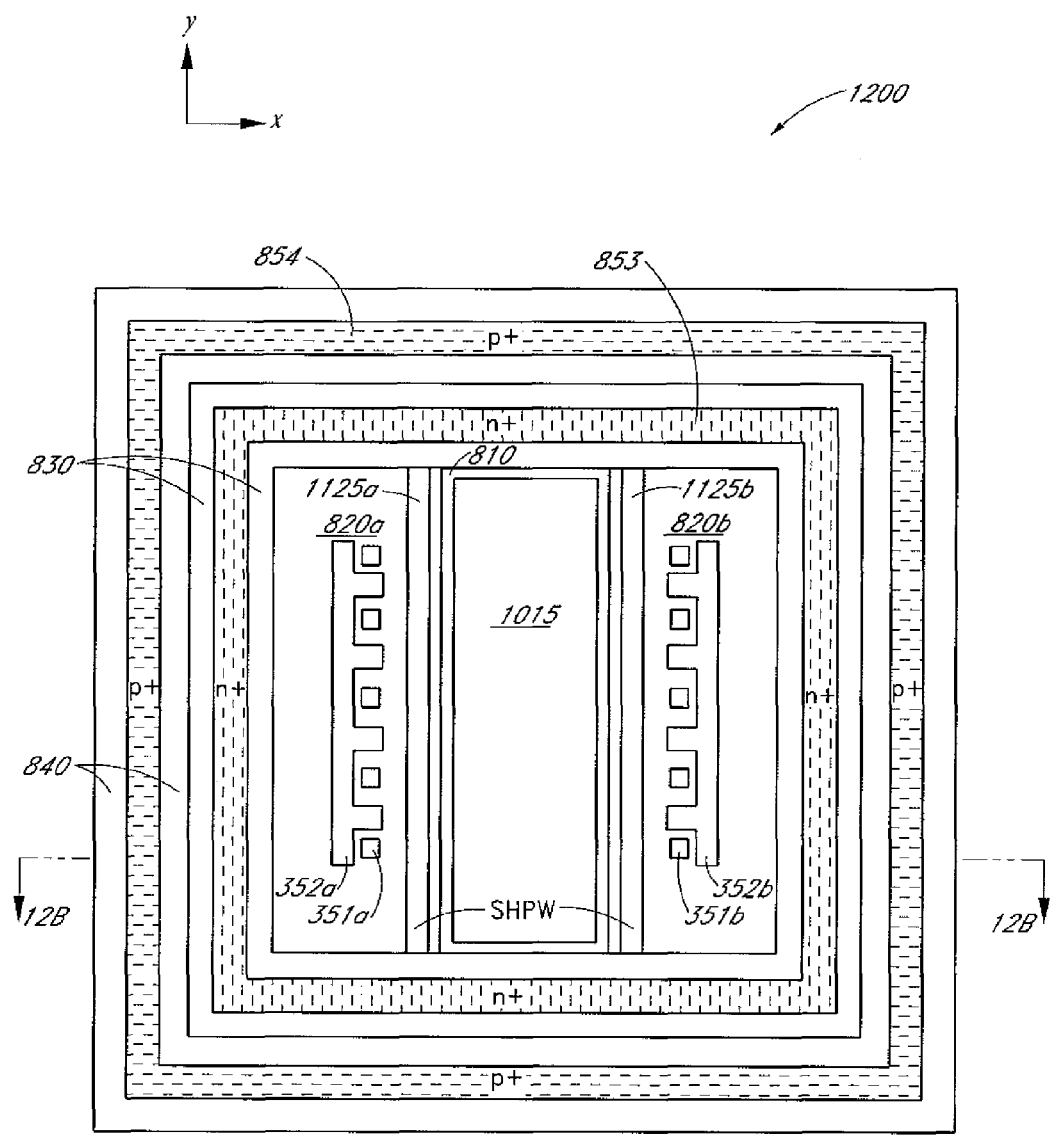
FIG. 12A is a schematic top plan view of an IC protection device having shallow P wells and a shallow N well according to yet another embodiment.
Figure 12B:
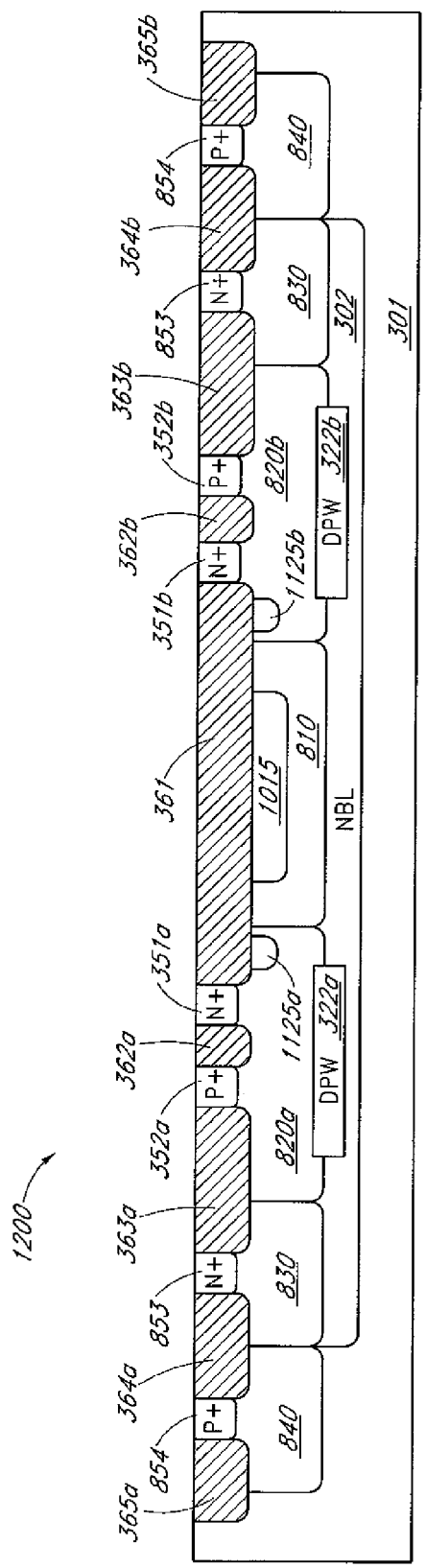
FIG. 12B is a cross section view of the IC protection device of FIG. 12A, taken along the line 12B-12B.

Referring to FIGS. 12A and 12B, a protection device according to yet another embodiment will be described below. FIG. 12A is a top plan view of the protection device 1200. FIG. 12B is a cross section of the protection device 1200 of FIG. 12, taken along the line 12B-12B.

The configuration of the protection device 1200 is the same as that of the protection device 800A of FIG. 5A except that the protection device 1200 includes a shallow N well 1015 in the central N well 810, a left shallow P well 1125a in the first left P well 820a, and a right shallow P well 1125b in the first right P well 820b. The details of the shallow N well 1015 and the shallow P wells 1125a, 1125b can be as described above in connection with FIGS. 10A, 10B, 11A, 11B, 11C, and 11D. In FIG. 12A, oxide regions, such as 361, 362a, 362b, 363a, 363b, 364a, 364b, 365a, 365b shown in FIG. 3A, are omitted for the sake of explanation of the wells.

Bi-Directional Protection Devices with Enhanced NPN Action

Figure 13:
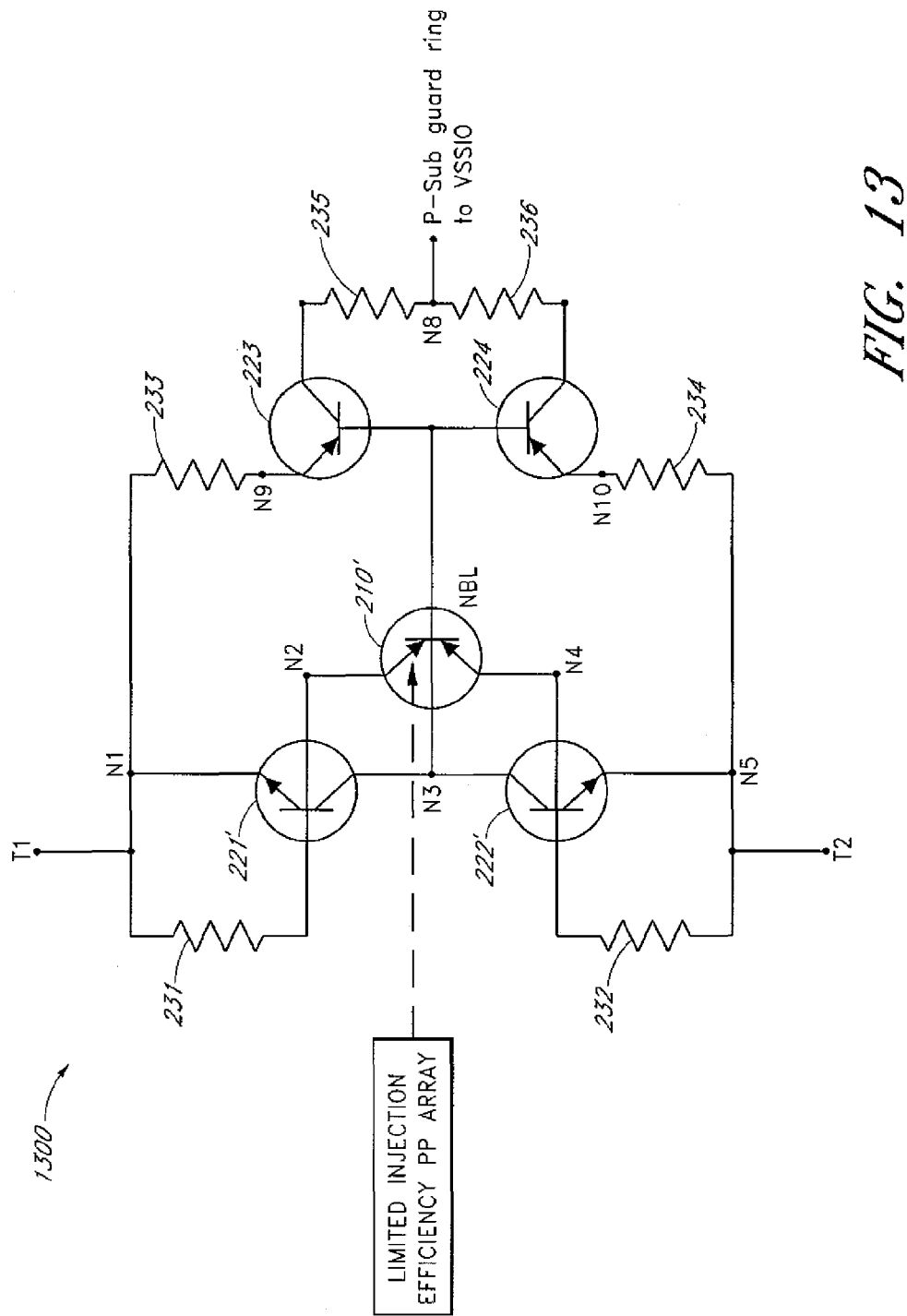
FIG. 13 is a circuit diagram illustrating a bi-directional IC protection circuit with enhanced NPN action according to another embodiment.

Referring to FIG. 13, a protection circuit 1300 according to another embodiment will be described below. The illustrated protection circuit 1300 includes first and second terminals T1, T2, a bi-directional bipolar device 210', a first transistor 221', a second transistor 222', a third transistor 223, a fourth transistor 224, first to sixth resistors 231-236, and first to tenth nodes N1-N10. The electrical connections among the components of the circuit 1300 are the same as those described above in connection with the protection circuit 200 of FIG. 2.

The protection circuit 1300 includes the first and second transistors 221', 222' that have enhanced NPN action compared to the transistors 221, 222 of the circuit 200 of FIG. 2. In addition, the protection circuit 1300 includes a bipolar device 210' having relatively low holes injection efficiency. In the illustrated embodiment, the transistors 221', 222', rather than the bipolar device 210', dominate during the device activation and the current discharge under an overvoltage stress, for example, an ESD event.

When the NPN action is enhanced, the maximum TLP current that can be sustained by the device per unit area is about 3 to 4 larger than that of the protection device with enhanced PNP action described above in connection with FIG. 2. This is due to the trade-off between the holding voltage and maximum TLP current to failure (maximum current Imax). A higher holding voltage can lead to lower maximum current to failure due to power and heat dissipation considerations.

In contrast, the PNP-enhanced devices (for example, the device 300 of FIG. 3A) can be configured for a higher holding voltage application while decreasing the maximum current (Imax). In NPN-enhanced devices, while the holding voltage can still be high (for example, >20V), it is not required for some application to have a holding voltage as high as in PNP-enhanced devices (the holding voltage can be specified to be higher than 45 V, for example, required for specific automotive IC applications). The NPN-enhanced devices allow a lower holding voltage and reduction in the footprint further by sustaining a higher current in a smaller device without compromising the ESD performance.

In other embodiments, for both operating conditions, one with a high holding voltage and another with a relatively lower, but still larger than 20V, holding voltage, a PNP-enhanced device and an NPN-enhanced device can be combined to overcome limitations for bi-directional operation with respect to operating condition, device footprint and capability for meeting design targets. Such combined embodiments can be used for various applications, for example, automotive and healthcare applications.

Figures 14A, 14B:
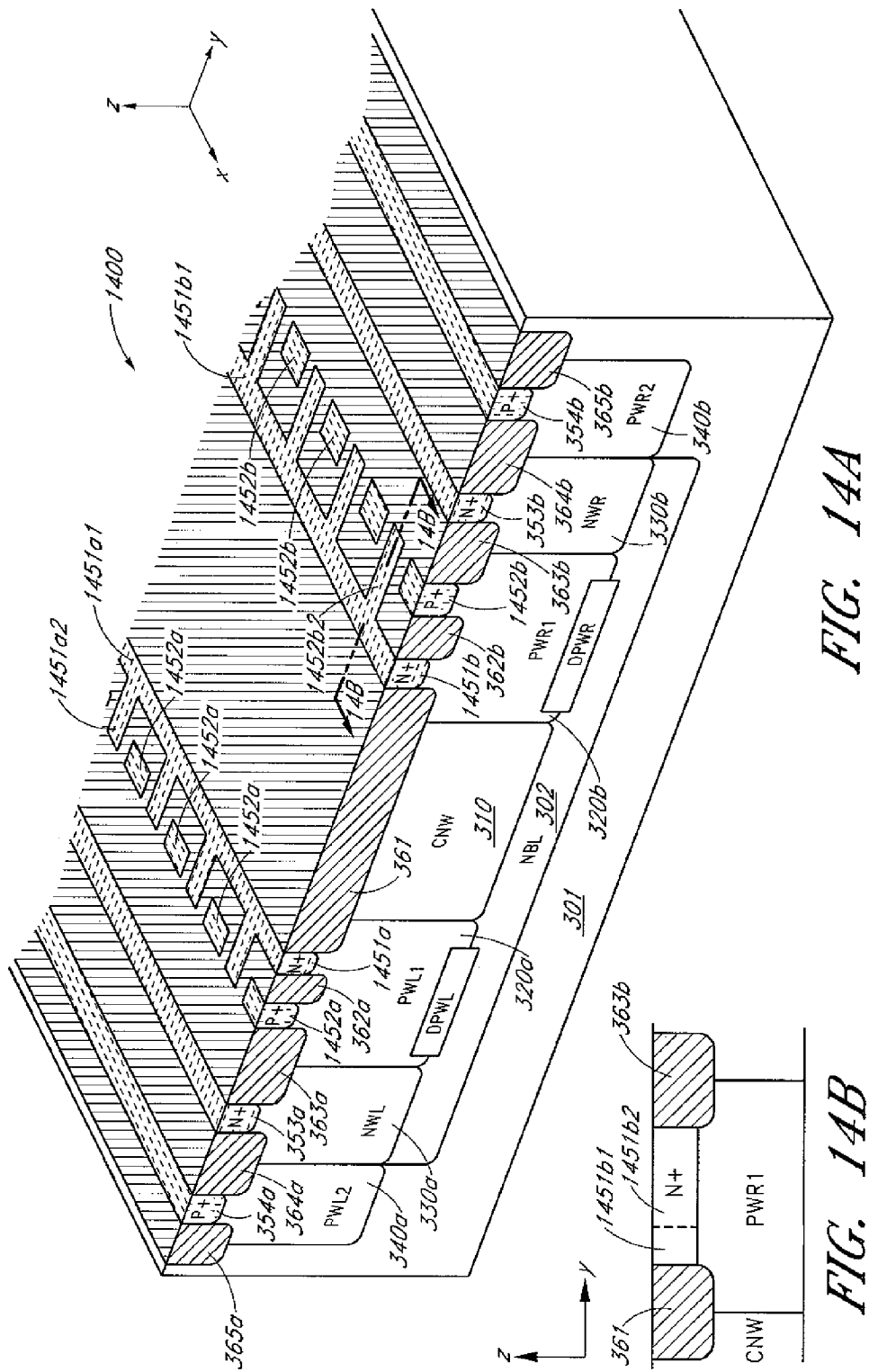
FIG. 14A is a schematic perspective view of an IC protection device implementing the IC protection circuit of FIG. 13 according to one embodiment.
FIG. 14B is a partial cross section view of the IC protection device of FIG. 14A, taken along the line 14B-14B.

Referring to FIGS. 14A and 14B, one implementation of the protection circuit 1300 of FIG. 13 will be described below. FIG. 14A is a partial perspective view of a protection device 1400 implementing the protection circuit 1300 of FIG. 13 according to one embodiment.

In the illustrated embodiment, the protection device 1400 is formed in a well of a substrate 301. Although not illustrated, the substrate 301 can also include other devices or ICs formed therein. In some embodiment, the protection device 1400 can be insulated from the other devices outside the well on the same monolithic integrated circuit. The protection device 1400 can include an N buried layer (NBL) 302 formed on the bottom of the well of the substrate 301.

The configuration of the protection device 1400 can be the same as that of the protection device 300 of FIG. 3A except that the protection device 1400 has a different structure of p-n arrays. The illustrated protection device 1400 includes (1) a first left n+ region 1451a and a plurality of first left p+ regions 1452a formed in the first left P well 320a, and (2) a first right n+ region 1451b and a plurality of first right p+ regions 1452b formed in the first right P well 320b.

The first left p+ regions 1452a are separated from one another and are aligned in the x direction in FIG. 14A when viewed from above. Similarly, the first right p+ regions 1452b are separated from one another and are aligned in the x direction in FIG. 14A when viewed from above.

The first left n+ region 1451a can include an elongated portion 1451a1 extending in the x direction, and a plurality of protruding portions 1451a2 extending in the y direction from the elongated portion 1451a1 toward the left N well 330a, as shown in FIG. 14B. The elongated portion 1451a1 is formed on the right side of the first left p+ regions 1452a in FIG. 14A. Each of the protruding portions 1451a2 extends in a space between respective two of the first left p+ regions 1452a. Similarly, the first right n+ region 1451b can include an elongated portion 1451b1 extending in the x direction, and a plurality of protruding portions 1451b2 extending in the y direction from the elongated portion 1451b1 toward the right N well 330b. The elongated portion 1451b1 is formed on the left side of the first right p+ regions 1452b in FIG. 14A. Each of the protruding portions 1451b2 extends in a space between respective two of the first right p+ regions 1452b.

In another embodiment, the first n+ regions 1451a, 1451b and the first p+ regions 1452a, 1452b can be separated from each other by stacks of dummy gate oxides and electrodes, similar to those shown in FIGS. 6A and 613. In yet another embodiment, the first n+ regions 1451a, 1451b and the first p+ regions 1452a, 1452b can abut each other, similar to those shown in FIG. 7. In other embodiments, the protection device 1400 can have different layouts, similar to those described above in connection with FIGS. 8A, 8B, 9A, and 9B. The protection device 1400 can have a shallow N well and/or shallow P wells as described above in connection with FIGS. 10A-11D.

The p-n arrays of the device 1400 can also provide a faster and relatively lower trigger voltage device response. The p-n arrays relate to NPN-enhanced action and higher electron injection efficiency as compared with the p-n array of the device 300 of FIG. 3A. Other options, such as a shallow N well and/or shallow P wells, can further provide the flexibility discussed above in fine tuning design the I-V characteristics to different trigger voltages, holding voltages, and/or maximum current levels.

Figure 15A:
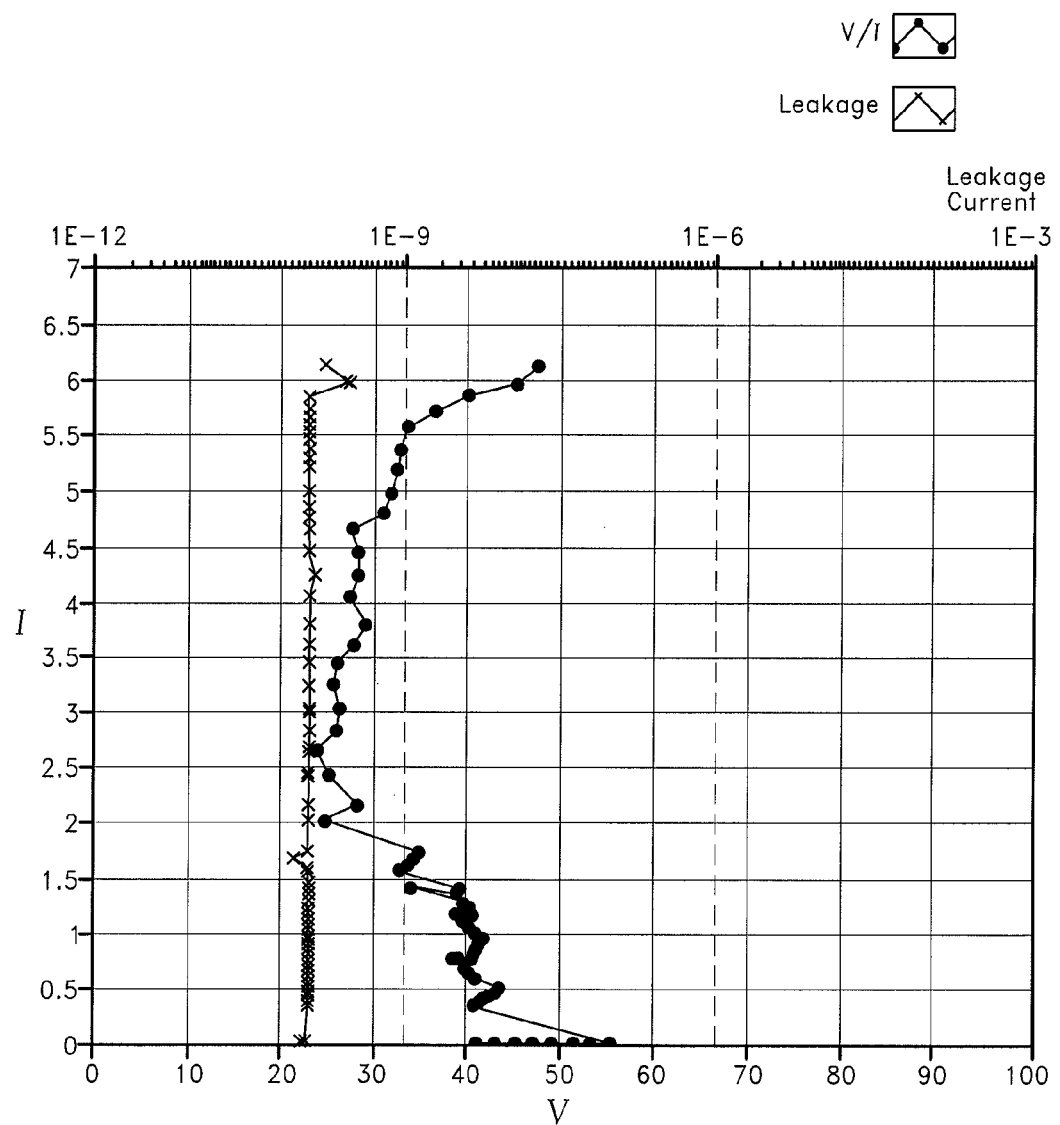
FIG. 15A is a graph showing a relationship between current and voltage of the protection device of FIG. 14A, resulting from the TLP quasi-static measurement during a positive ESD stress for the embodiment in FIG. 14A. Symmetrical TLP current and voltage characteristics are obtained in the embodiment for a negative ESD stress.
Figure 15B:
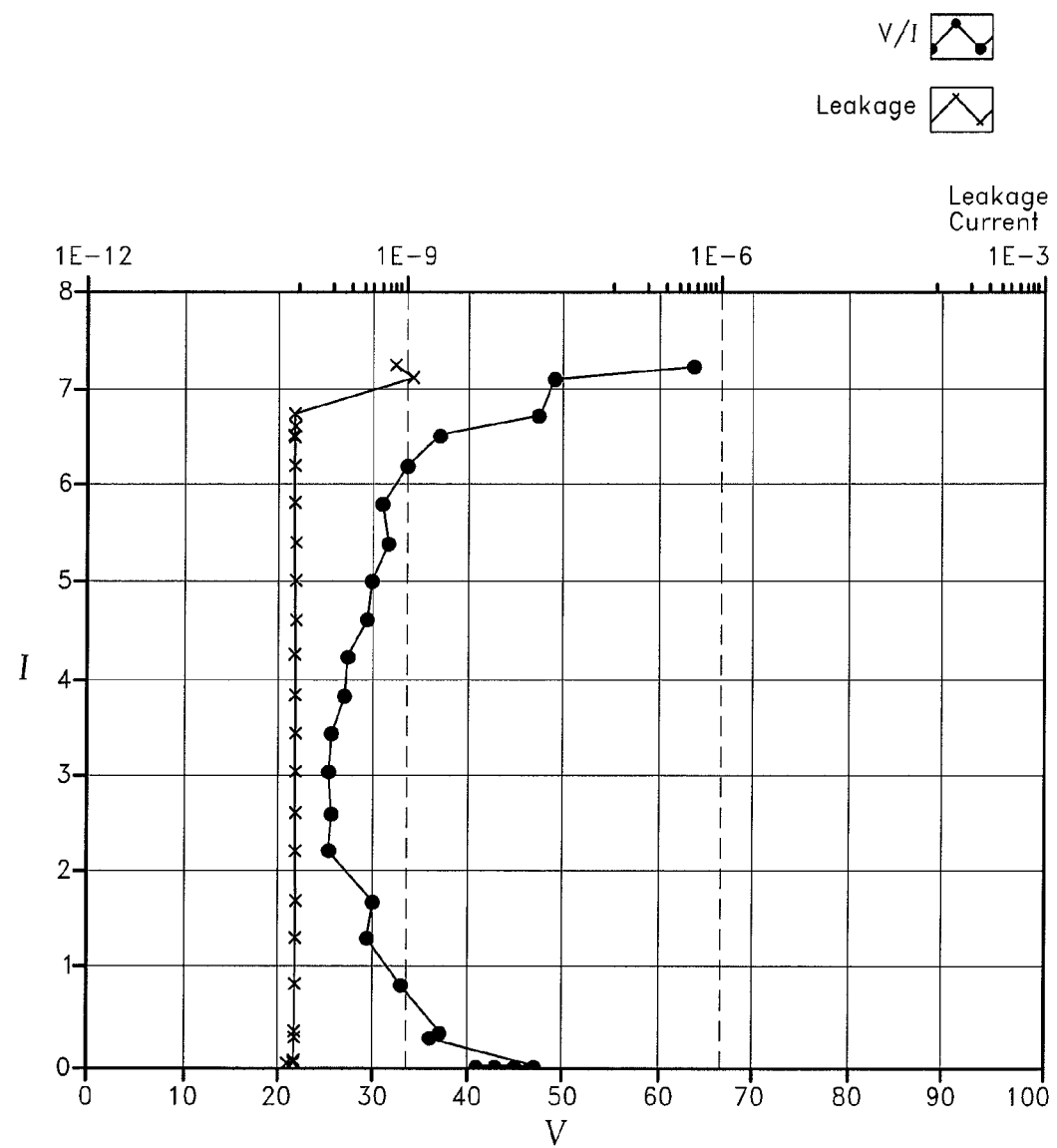
FIG. 15B is a graph showing a relationship between current and voltage, resulting from the TLP quasi-static measurement during a positive ESD stress for an embodiment similar to the embodiment of FIG. 14A, but also including a shallow N well inside a central N well for a lower trigger voltage as in the embodiment of FIG. 10B. Symmetrical TLP current and voltage characteristics are obtained in this embodiment for a negative ESD stress.

FIG. 15A shows a graph resulting from an example TLP measurement of a protection device according to the embodiment of FIGS. 14A and 14B when there is a positive ESD event. In the measurement, a leakage test voltage of 45.00 V, a leakage current limit of 5.00E-4 A, a maximum pulse voltage of 250.00 V, a start pulse voltage of 20.00 V, a test step voltage of 1.00 V, a pulse current limit of 7.00 A, a pulse width of 100 ns, and pulse rise time of 0.200 ns were used. Besides the lower holding voltage in this embodiment, the trigger voltage is also lower than the one obtained for the embodiment in FIG. 3A, see TLP response in FIGS. 10A and 10B. For a similar positive ESD event, FIG. 15B shows a graph resulting from an example TLP measurement of the protection device according to the embodiment of FIGS. 14A and 14B, but including a shallow N well region 1015 in the central N well region 310 as described in connection with FIGS. 10A and 10B. In the measurement, a leakage test voltage of 45.00 V, a leakage current limit of 5.00E-4 A, a maximum pulse voltage of 250.00 V, a start pulse voltage of 20.00 V, a test step voltage of 1.00 V, a pulse current limit of 8.00 A, a pulse width of 100 ns, and pulse rise time of 0.200 ns were used. The protection device providing the I-V response in FIG. 15B has a lower (absolute) trigger voltage than the protection device of FIGS. 14A and 14B (see the graphs of FIGS. 15A). The lower trigger voltage was achieved by forming a lower voltage blocking junction with the inclusion of the shallow N well defined between the central N well region 310 and the first left and right P well regions 320a, 320b. For comparison, the NPN-enhanced embodiment in FIG. 15B adjusted for a trigger voltage in the range of 45 to 50 V, a holding voltage higher than 20V and a maximum current Imax>6 A can have about 0.016 mm² footprint area. The current handling capability per unit area (Fm=Imax/Area) ratio factor in this embodiment increases to about Fm≈0.39 mA/μm² as compared to the factor obtained earlier in connection with FIG. 10C.

Asymmetrical Bi-Directional Protection Devices

In the embodiments described above, the bi-directional protection devices have a symmetrical structure such that current-voltage characteristics are also symmetrical when positive and negative events occur. In certain applications, however, it is desirable to provide asymmetrical current-voltage characteristics when positive and negative events occur. Such asymmetrical current-voltage characteristics can be provided by a bi-directional protection device having different dimensions and/or structures for protection against positive and negative ESD events.

Figure 16:
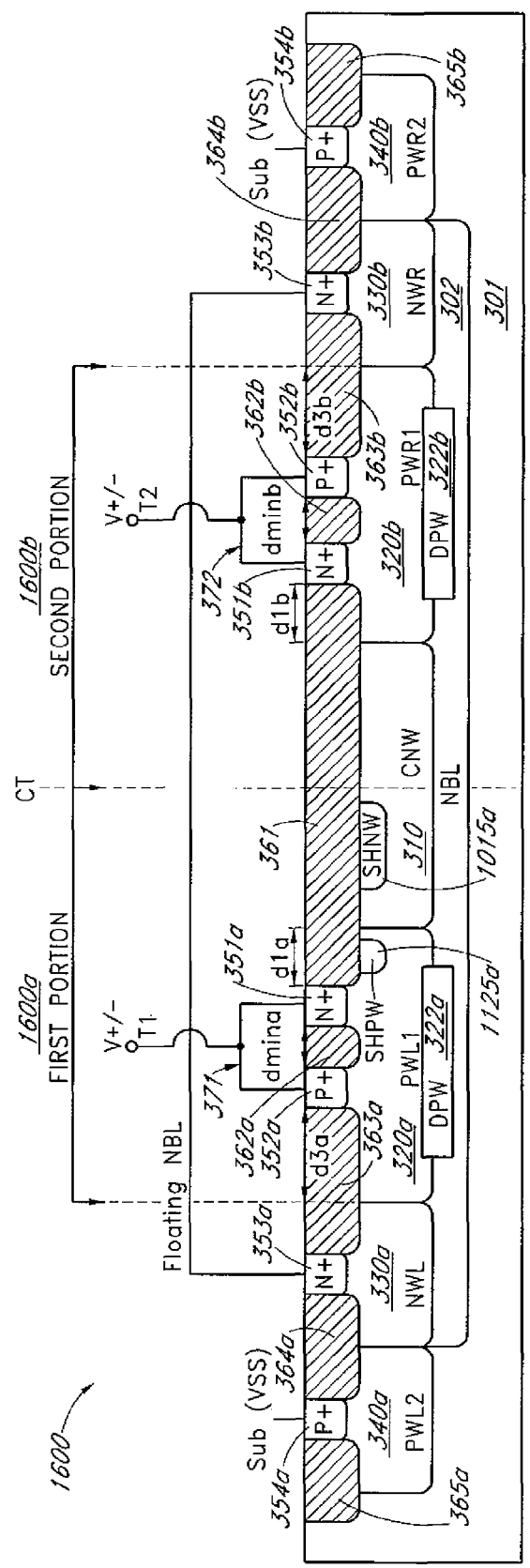
FIG. 16 is a cross section view of an IC protection device including two asymmetric portions for independently adjusting positive and negative current and voltage responses during positive and negative ESD stresses, respectively, according to yet another embodiment.

Referring to FIG. 16, an asymmetrical bi-directional protection device according to one embodiment will be described below. In the illustrated embodiment, the protection device 1600 is formed in a well of a substrate 301. Although not illustrated, the substrate 301 can also include other devices or ICs formed therein. In some embodiments, the protection device 1600 can be insulated from the other devices outside the well on the same monolithic integrated circuit. The protection device 1600 can include an N buried layer (NBL) 302 formed on the bottom of the well of the substrate 301.

In the illustrated embodiment, the protection device 1600 includes a first portion 1600a and 1600b that is asymmetrical about the central line CT. In one embodiment, a first distance d1a between the first left n+ regions 351a and the central N well 310 can be different from a second distance d1b between the first right n+ regions 351b and the central N well 310. In another embodiment, a first minimum distance $d_{mina}$ between the first left n+ regions 351a and the first left p+ region 352a can be different from a second minimum distance $d_{minb}$ between the first right n+ regions 351b and the first right p+ region 352b. In yet another embodiment, a third distance d3a between the first left p+ region 352a and the left N well 330a can be different from a fourth distance d3b between the first right p+ region 352b and the right N well 330b. The protection device 1600 can have one or more of the differences in any of dimensions, depending on the desired ESD characteristics.

In the illustrated embodiment, the first portion 1600a also includes a shallow P well 1125a and a shallow N well 1015a, but the second portion 1600b does not include them. This asymmetrical structure is only exemplary, and various other regions combinations for providing asymmetrical ESD characteristics are possible. Examples of such combinations, without limitation, are provided in Table 2 below.

TABLE 2

|  | First Portion 1600a | Second Portion 1600b |
| --- | --- | --- |
| p-n array (351a, 352a, 351b, 352b) | Any of embodiments shown in FIGS. 3A-3D, 6A, 6B, 7, 14A, and 14B | Any of embodiments shown in FIGS. 3A-3D, 6A, 6B, 7, 14A, and 14B |
| Shallow N well | None or the embodiment of FIGS. 10A and 10B | None or the embodiment of FIGS. 10A and 10B |
| Shallow P well | None or any of the embodiments of FIGS. 11A-11D | None or any of the embodiments of FIGS. 11A-11D |
| Dimensions of and distances between wells, p+ regions, and n+ regions | Any suitable dimension | Any suitable dimension |

In all the embodiments described above, the protections devices can include layers, regions, and wells having either n-type or p-type dopants. In other embodiments, the doping types of all the layers, regions, and wells of the protection devices can be opposite to those described and shown in the above embodiments, and the same principles and advantages can still apply to the other embodiments. For example, a complementary version of the protection device of FIG. 3A can be formed in a substrate having an n epitaxial layer formed thereon. In such an embodiment, the N buried layer of the protection device of FIG. 3A is replaced with a P buried layer. The N wells and P wells of the protection device are replaced with P wells and N wells, respectively. The n+ regions and p+ regions of the protection device are replaced with p+ regions and n+ regions, respectively. Similarly, complementary versions of the protection devices of FIGS. 6A, 7, 8A, 8B, 9A, 10A, 11A, 12A, 14A, and 16 are also possible under the same principle described above.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a vehicle engine management controller, a transmission controller, a seatbelt controller, an anti-lock brake system controller, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for providing protection from transient electrical events, the apparatus comprising a protection device which includes:
   a substrate;
   a central well disposed in the substrate, wherein the central well has a doping of a first type;
   a first well disposed in the substrate adjacent to the central well, wherein the first well has a doping of a second type opposite to the first type;
   a second well disposed in the substrate adjacent to the central well and opposite side of the central well from the first well, wherein the second well has a doping of the second type;
   a first active region and a second active region disposed in the first well, the second active region having a portion farther from the central well than at least a portion of the first active region, the first active region having a doping of the first type, the second active region having a doping of the second type;
   a third active region and a fourth active region disposed in the second well, the fourth active region having a portion farther from the central well than at least a portion of the third active region, the third active region having a doping of the first type, the fourth active region having a doping of the second type;

wherein the central well, the first well, and the second well are configured to operate as a bi-directional bipolar device having an emitter/collector, a base, and a collector/emitter;

wherein the first active region, the second active region, the first well, and the central well are configured to operate as a first bipolar transistor having an emitter, a base, and a collector;

wherein the third active region, the fourth active region, the second well, and the central well are configured to operate as a second bipolar transistor having an emitter, a base, and a collector.

2. The apparatus of claim 1, further comprising a buried layer disposed beneath the central well, the first well, and the second well, the buried layer having a doping of the first type.

3. The apparatus of claim 1, further comprising:
a third well disposed in the substrate adjacent to the first well and opposite side of the first well from the central well, wherein the third well has a doping of the first type; and
a fourth well disposed in the substrate adjacent to the second well and opposite side of the second well from the central well, wherein the fourth well has a doping of the first type.

4. The apparatus of claim 3, further comprising:
a fifth well disposed in the substrate adjacent to the third well and opposite side of the third well from the first well, wherein the fifth well has a doping of the second type; and
a sixth well disposed in the substrate adjacent to the fourth well and opposite side of the fourth well from the second well, wherein the sixth well has a doping of the second type.

5. The apparatus of claim 4, further comprising a fifth active region disposed in the third well, and a sixth active region disposed in the fourth well, wherein each of the fifth and sixth active regions has a doping of the first type.

6. The apparatus of claim 5, further comprising a seventh active region disposed in the fifth well, and an eighth active region disposed in the sixth well, wherein each of the seventh and eighth active regions has a doping of the second type.

7. The apparatus of claim 1, further comprising a first deep well underneath the first well, and a second deep well underneath the second well, wherein each of the first and second deep wells has a doping of the second type.

8. The apparatus of claim 1, wherein the first active region comprises a plurality of first separated regions generally aligned in a direction,
wherein the portion of the second active region forms a first elongated portion extending in the direction such that the plurality of first separated regions are interposed between the first elongated portion and the central well when viewed from above,
wherein the third active region comprises a plurality of second separated regions generally aligned in the direction,
wherein the portion of the fourth active region forms a second elongated portion extending in the direction such that the plurality of second separated regions are interposed between the second elongated portion and the central well when viewed from above.

9. The apparatus of claim 1, wherein the second active region comprises a plurality of first separated regions generally aligned in a direction,
wherein the at least a portion of the first active region forms a first elongated portion extending in the direction such that the first elongated portion is interposed between the plurality of first separated regions and the central well when viewed from above,
wherein the fourth active region comprises a plurality of second separated regions generally aligned in the direction,
wherein the at least a portion of the third active region forms a second elongated portion extending in the direction such that the second elongated portion is interposed between the plurality of second separated regions and the central well when viewed from above.

10. The apparatus of claim 1, wherein the first active region and the second active region are separated by shallow trench isolation.

11. The apparatus of claim 1, wherein the first active region and the second active region are laterally spaced apart from each other with a gap therebetween, wherein the apparatus further comprises an oxide layer formed on the second well over the gap, and a conductive layer formed on the oxide layer.

12. The apparatus of claim 1, wherein the first active region and the second active region laterally abut each other.

13. The apparatus of claim 1, further including a shallow well having a doping of the first type and disposed inside the central well.

14. The apparatus of claim 13, further including a first shallow well having a doping of the second type and disposed inside the first well, and a second shallow well having a doping of the second type and disposed inside the second well.

15. The apparatus of claim 1, further including a first shallow well having a doping of the second type and disposed inside the first well, and a second shallow well having a doping of the second type and disposed inside the second well.

16. The apparatus of claim 15, wherein at least one of the first or second shallow well includes at least one through-hole extending in a vertical direction, the at least one through-hole being filled with the same material as the material of the first or second well.

17. The apparatus of claim 1, wherein the first well, the first active region, and the second active region form at least part of a first half portion of a bi-directional protection device, wherein the second well, the third active region, and the fourth active region form at least part of a second half portion of the protection device, and wherein the first and second half portions are symmetrical in structure about the central well.

18. The apparatus of claim 1, wherein the first well, the first active region, and the second active region form at least part of a first half portion of a bi-directional protection device, wherein the second well, the third active region, and the fourth active region form at least part of a second half portion of the protection device, and wherein the first and second half portions are asymmetrical in structure about the central well.

19. The apparatus of claim 1, further comprising a third well ring disposed in the substrate and laterally surrounding the central well, the first well, and the second well, and a fifth active region disposed in the third well ring and extending along the third well ring, wherein the third well ring and the fifth active region have a doping of the first type.

20. The apparatus of claim 19, further comprising a fourth well ring disposed in the substrate and laterally surrounding the third well ring, and a sixth active region disposed in the fourth well ring and extending along the fourth well ring, wherein the fourth well ring and the sixth active region have a doping of the second type.

21. The apparatus of claim 1, further comprising a second protection device which includes:
- a second central well disposed in the substrate, wherein the second central well has a doping of the first type;
- a third well disposed in the substrate adjacent to the second central well, wherein the third well has a doping of the second type;
- a fourth well disposed in the substrate adjacent to the second central well and opposite side of the second central well from the third well, wherein the fourth well has a doping of the second type;
- a fifth active region and a sixth active region disposed in the third well, the sixth active region having a portion farther from the second central well than at least a portion of the fifth active region, the fifth active region having a doping of the first type, the sixth active region having a doping of the second type;
- a seventh active region and an eighth active region disposed in the fourth well, the eighth active region having a portion farther from the second central well than at least a portion of the seventh active region, the seventh active region having a doping of the first type, the eighth active region having a doping of the second type;
- wherein the second central well, the third well, and the fourth well are configured to operate as a second bi-directional bipolar device having an emitter/collector, a base, and a collector/emitter,
- wherein the fifth active region, the sixth active region, the third well, and the second central well are configured to operate as a third bipolar transistor having an emitter, a base, and a collector,
- wherein the seventh active region, the eighth active region, the fourth well, and the second central well are configured to operate as a fourth bipolar transistor having an emitter, a base, and a collector.

22. The apparatus of claim 21, wherein the second well and the third well are adjacent to each other with a gap therebetween, wherein the apparatus further comprises:
- a first well ring having a doping of the first type, the first well laterally surrounding the protection device and the second protection device, and including a portion extending through the gap between the second well and the third well; and
- a first active ring disposed in the first well ring, and laterally surrounding the protection device and the second protection device, and including a portion extending through the gap between the second well and the third well.

23. The apparatus of claim 1, wherein the central well extends to form a first annular ring of the first doping type, wherein the first well extends to form a second annular ring of the second doping type laterally surrounded by the first annular ring, and wherein the second well of the second doping type extends to form a third annular ring laterally surrounding the first annular ring.

24. The apparatus of claim 23, wherein the protection device further comprises a region having a doping of the first type, and being laterally surrounded by the second annular ring; a fourth annular ring having a doping of the first type and laterally surrounding the third annular ring; and a fifth annular ring having a doping of the second type and laterally surrounding the fourth annular ring.

25. The apparatus of claim 23, wherein the first active region comprises a plurality of first separated regions generally aligned annularly in the second annular ring, wherein the portion of the second active region forms a first elongated portion extending annularly such that the plurality of first separated regions are interposed between the first elongated portion and the first annular ring when viewed from above,
wherein the third active region comprises a plurality of second separated regions generally aligned annularly in the third annular ring, and
wherein the portion of the fourth active region forms a second elongated portion extending annularly such that the plurality of second separated regions are interposed between the second elongated portion and the first annular ring when viewed from above.

26. The apparatus of claim 23, wherein the second active region comprises a plurality of first separated regions generally aligned annularly in the second annular ring,
wherein the at least a portion of the first active region forms a first elongated portion extending annularly such that the first elongated portion is interposed between the plurality of first separated regions and the first annular ring when viewed from above,
wherein the fourth active region comprises a plurality of second separated regions generally aligned annularly in the third annular ring,
wherein the at least a portion of the third active region forms a second elongated portion extending annularly such that the second elongated portion is interposed between the plurality of second separated regions and the first annular ring when viewed from above.

27. A method for providing protection from transient electrical events, the method comprising:
- providing a substrate;
- forming a central well in the substrate, wherein the central well has a doping of a first type;
- forming a first well in the substrate adjacent to the central well, wherein the first well has a second polarity type opposite to the first type;
- forming a second well in the substrate adjacent to the central well and opposite side of the central well from the first well, wherein the second well has a doping of the second type;
- forming a first active region and a second active region in the first well, the second active region having a portion farther from the central well than at least a portion of the first active region, the first active region having a doping of the first type, the second active region having a doping of the second type;
- forming a third active region and a fourth active region in the second well, the fourth active region having a portion farther from the central well than at least a portion of the third active region, the third active region having a doping of the first type, the fourth active region having a doping of the second type,
- wherein the central well, the first well, and the second well are configured to operate as a bi-directional bipolar device having an emitter/collector, a base, and a collector/emitter,
- wherein the first active region, the second active region, the first well, and the central well are configured to operate as a first bipolar transistor having an emitter, a base, and a collector,
- wherein the third active region, the fourth active region, the second well, and the central well are configured to operate as a second bipolar transistor having an emitter, a base, and a collector.

28. The method of claim 27, further comprising forming a buried layer beneath the central well, the first well, and the second well, the buried layer having a doping of the first type.

29. The method of claim 27, further comprising:
forming a third well in the substrate adjacent to the first well and opposite side of the first well from the central well, wherein the third well has a doping of the first type;
forming a fourth well in the substrate adjacent to the second well and opposite side of the second well from the central well, wherein the fourth well has a doping of the first type;
forming a fifth well in the substrate adjacent to the third well and opposite side of the third well from the first well, wherein the fifth well has a doping of the second type; and
forming a sixth well in the substrate adjacent to the fourth well and opposite side of the fourth well from the second well, wherein the sixth well has a doping of the second type.

30. The method of claim 29, further comprising: forming a fifth active region in the third well, a sixth active region in the fourth well, a seventh active region in the fifth well, and an eighth active region in the sixth well, wherein each of the fifth and sixth active regions has a doping of the first type, and wherein each of the seventh and eighth active regions has a doping of the second type.

31. The method of claim 27, wherein the first active region comprises a plurality of first separated regions generally aligned in a direction,
wherein the portion of the second active region forms a first elongated portion extending in the direction such that the plurality of first separated regions are interposed between the first elongated portion and the central well when viewed from above,
wherein the third active region comprises a plurality of second separated regions generally aligned in the direction,
wherein the portion of the fourth active region forms a second elongated portion extending in the direction such that the plurality of second separated regions are interposed between the second elongated portion and the central well when viewed from above.

32. The method of claim 27, wherein the second active region comprises a plurality of first separated regions generally aligned in a direction,
wherein the at least a portion of the first active region forms a first elongated portion extending in the direction such that the first elongated portion is interposed between the plurality of first separated regions and the central well when viewed from above,
wherein the fourth active region comprises a plurality of second separated regions generally aligned in the direction,
wherein the at least a portion of the third active region forms a second elongated portion extending in the direction such that the second elongated portion is interposed between the plurality of second separated regions and the central well when viewed from above.

* * * * *